United States Patent
Kantake

(10) Patent No.: US 7,107,166 B2
(45) Date of Patent: Sep. 12, 2006

(54) DEVICE FOR TESTING LSI TO BE MEASURED, JITTER ANALYZER, AND PHASE DIFFERENCE DETECTOR

(75) Inventor: Shuusuke Kantake, Tokyo (JP)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/500,427

(22) PCT Filed: Jan. 9, 2003

(86) PCT No.: PCT/JP03/00120

§ 371 (c)(1),
(2), (4) Date: Jun. 28, 2004

(87) PCT Pub. No.: WO03/060533

PCT Pub. Date: Jul. 24, 2003

(65) Prior Publication Data

US 2005/0080580 A1 Apr. 14, 2005

(30) Foreign Application Priority Data

Jan. 10, 2002 (JP) ............................ 2002-003866

(51) Int. Cl.
*G01R 23/10* (2006.01)
(52) U.S. Cl. ........................................ 702/78; 714/724
(58) Field of Classification Search ................ 702/58, 702/69, 72, 79, 104, 117, 118, 124, 125, 126, 702/189, 78; 714/718, 727, 742, 743; 324/617, 324/765
See application file for complete search history.

(56) References Cited

U.S. PATENT DOCUMENTS

| | | | | |
|---|---|---|---|---|
| 5,384,541 A | * | 1/1995 | Chu et al. .................... | 324/617 |
| 5,453,995 A | * | 9/1995 | Behrens ....................... | 714/743 |
| 6,058,496 A | * | 5/2000 | Gillis et al. .................. | 714/727 |
| 6,182,255 B1 | * | 1/2001 | Ohtomo ....................... | 714/724 |
| 6,356,096 B1 | * | 3/2002 | Takagi et al. ................ | 324/765 |
| 6,374,392 B1 | * | 4/2002 | Ochiai et al. .................. | 716/6 |
| 6,378,098 B1 | * | 4/2002 | Yamashita ................... | 714/742 |
| 6,457,148 B1 | * | 9/2002 | Yoshiba ....................... | 714/718 |
| 6,499,334 B1 | * | 12/2002 | Kobayashi ................... | 73/1.42 |
| 6,532,579 B1 | * | 3/2003 | Sato et al. ...................... | 716/8 |
| 6,606,575 B1 | * | 8/2003 | Miller ......................... | 702/104 |

FOREIGN PATENT DOCUMENTS

| | | |
|---|---|---|
| JP | 56-16547 | 4/1981 |
| JP | 62-011181 | 1/1987 |
| JP | 62-133360 | 6/1987 |

(Continued)

*Primary Examiner*—Patrick Assouad
*Assistant Examiner*—Mohamed Charioui
(74) *Attorney, Agent, or Firm*—Muramatsu & Associates

(57) ABSTRACT

LSI test equipment can acquire output data of an LSI as a device under test by a clock signal output from the LSI to be measured and acquire measurement data synchronously with the output data having jitter. The LSI test equipment includes a clock side time interpolator for acquiring the clock output from the LSI to be measured by a plurality of strobes having a predetermined timing interval and outputting it as encoded level data of time series, a data side time interpolator for acquiring the output data from the LSI to be measured by a plurality of strobes having a predetermined timing interval and outputting it as level data of time series, and a selector for receiving the level data from both of the time interpolators, selecting output data at the clock edge timing, and outputting it as data to be measured.

11 Claims, 11 Drawing Sheets

FOREIGN PATENT DOCUMENTS

| | | |
|---|---|---|
| JP | 63-148176 | 6/1988 |
| JP | 64-019827 | 1/1989 |
| JP | 01-164118 | 6/1989 |
| JP | 2000-314767 | 11/2000 |
| WO | WO97/04327 | 2/1997 |

* cited by examiner

FIG.2
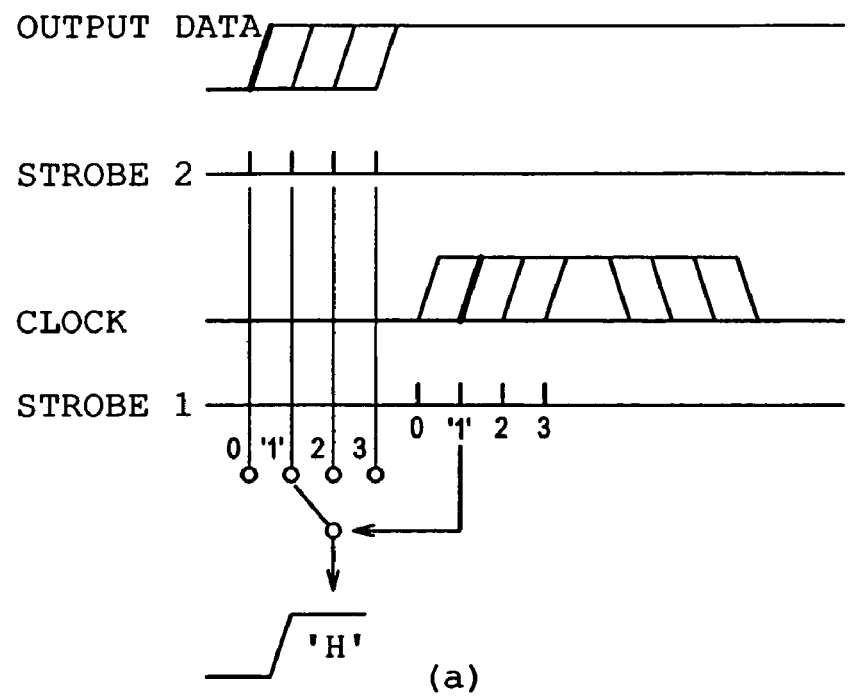
(a)
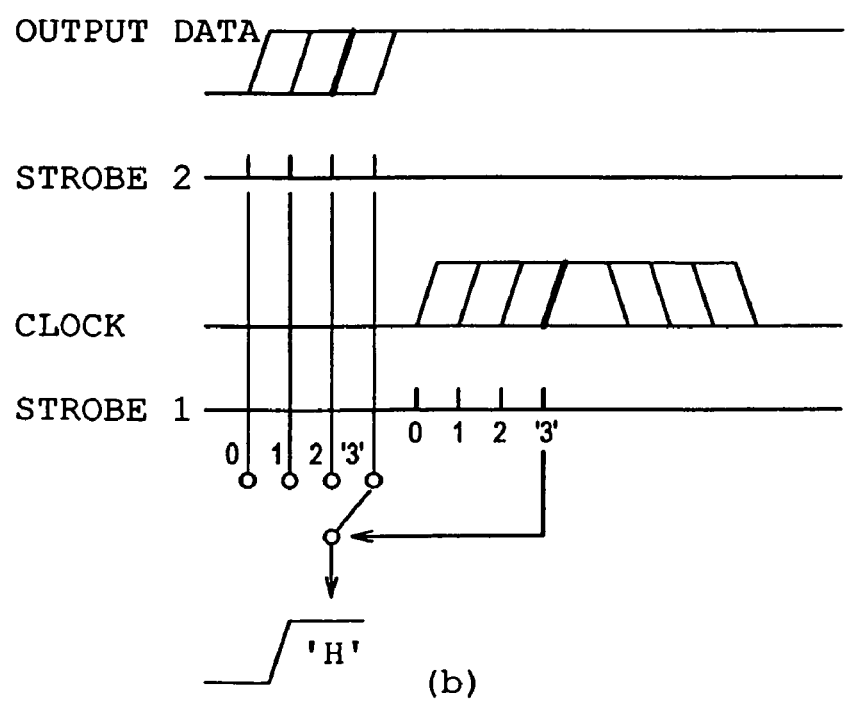
(b)

FIG.8
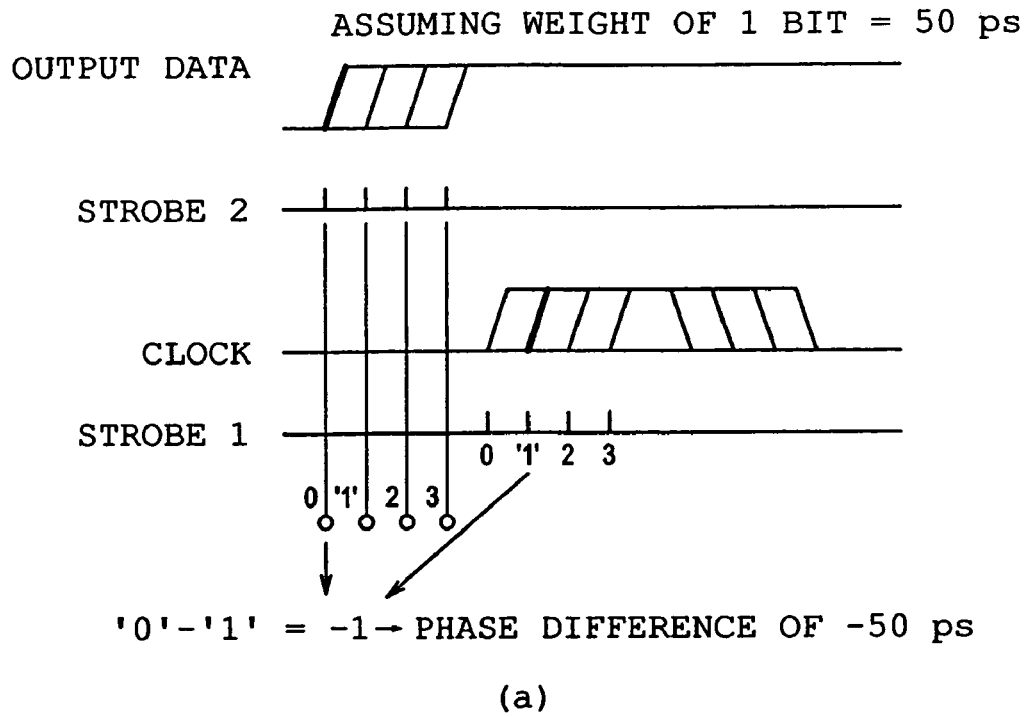
(a)
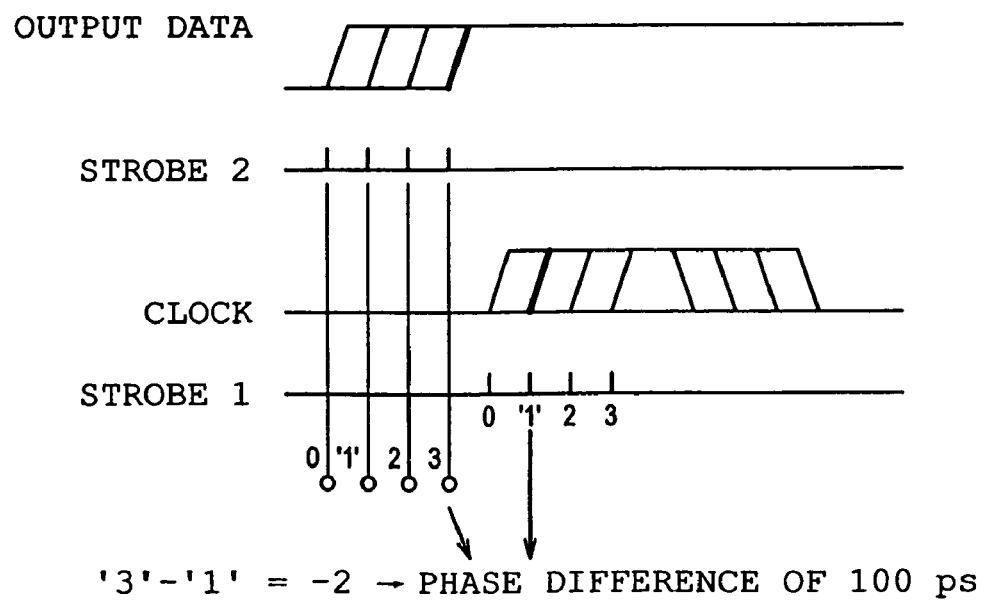
(b)

FIG.11
(Prior Art)
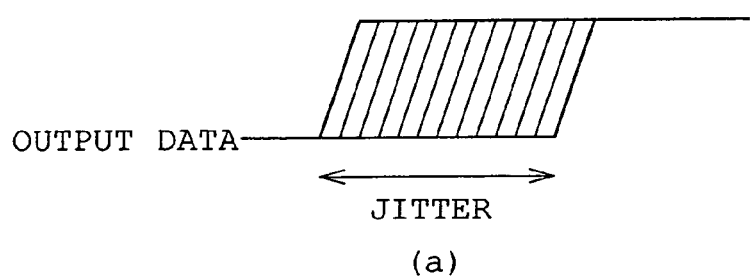
(a)
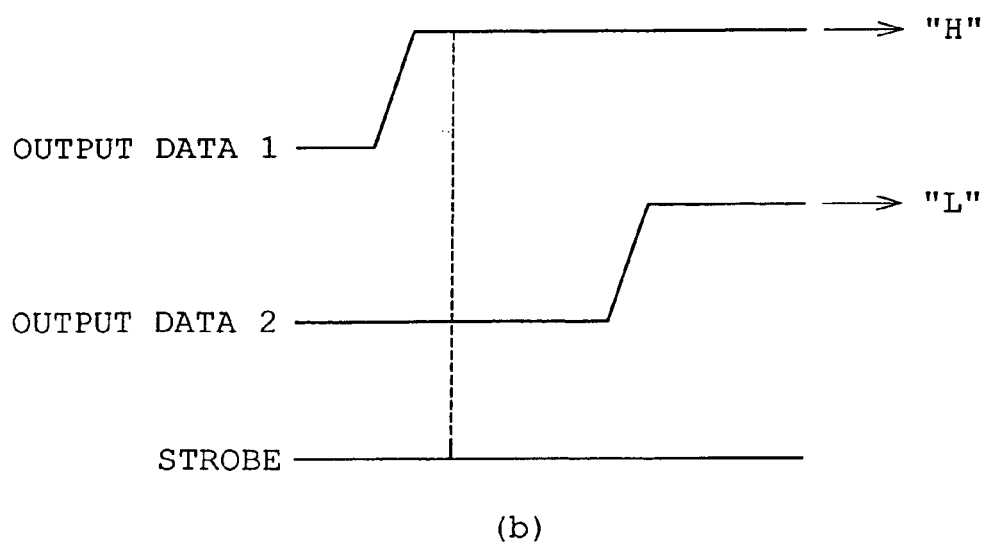
(b)

ical Field

DEVICE FOR TESTING LSI TO BE MEASURED, JITTER ANALYZER, AND PHASE DIFFERENCE DETECTOR

TECHNICAL FIELD

The present invention relates to a test equipment for a function test in which output data output from an LSI as a device under test is compared with predetermined expectation value data to judge whether or not the LSI to be measured is failure, a jitter analyzer for analyzing a jitter of a clock or output data of an LSI to be measured which is a function test object, and a phase difference detector which detects a phase difference between a clock and output data of an LSI to be measured.

The present invention relates particularly to test equipment, in which a source synchronous circuit capable of acquiring a clock and output data output from an LSI to be measured as level data in a time series; in which a clock signal output from the LSI to be measured is accordingly usable as a timing signal to take in the output data of the LSI to be measured; which is capable of taking in the output data at a signal change point synchronized with a jitter; which is capable of obtaining a correct test result without being influenced by the jitter; and which is suitable for a function test of a high-rate LSI having a data rate exceeding, for example, 1 GHz.

Moreover, the present invention relates to a jitter analyzer and a phase difference detector of an LSI to be measured, in which level data in a time series indicating a clock and output data of the LSI to be measured is acquired by a source synchronous circuit to easily and securely perform jitter analysis of the LSI to be measured and detection of a phase difference between the clock and output data by a jitter.

BACKGROUND ART

In general, test equipment to perform a function test of an LSI (hereinafter referred to as "LSI tester") inputs a predetermined test pattern signal into an LSI to be measured which is an object to be tested (device under test: DUT), compares output data output from the LSI to be measured with a predetermined expectation value pattern signal, and judges agreement/disagreement to detect/judge whether or not the LSI to be measured is failure.

Conventional test equipment for an LSI to be measured will be described hereinafter with reference to FIG. 10.

FIG. 10 is a block diagram showing a conventional constitution of the test equipment for the LSI to be measured.

As shown in the figure, a conventional LSI tester 110 comprises: the LSI tester 110 including a level comparator 111 which compares a level of output data of an LSI to be measured 101 with that of a comparison voltage; a pattern comparator 112 which compares the output data of the LSI to be measured 101 with a predetermined expectation value; and a flip flop 121 for inputting the output data of the LSI to be measured 101 into the pattern comparator 112 at a predetermined timing.

In the conventional test equipment for the LSI to be measured constituted in this manner, first a predetermined test pattern signal is input to the LSI to be measured 101 from a pattern generation unit (not shown), and a signal responsive to the test pattern siganl is output as the output data from the LSI to be measured 101.

The output data output from the LSI to be measured 101 is input into the level comparator 111 of the LSI tester 110.

The output data input into the level comparator 111 is level-compared with the comparison voltage, and output to the flip flop 121. In the flip flop 121, the signal from the level comparator 111 is held as input data, and the output data is output at a predetermined timing using strobe from a timing generation unit (not shown) as a clock signal.

The output data output from the flip flop 121 is input into the pattern comparator 112, and compared with predetermined expectation value data output from a pattern generation unit in the tester, and a comparison result is output. Moreover, agreement/disagreement between the output data and expectation value is detected by the comparison result, and it is judged whether or not the LSI to be measured 101 is failure (pass/fail).

In this manner, in the conventional LSI tester, the output data output from the LSI to be measured is acquired at a timing of strobe output at a predetermined timing in the tester, and an output timing of the strobe has been fixed. However, since the output data of the LSI to be measured has a jitter (irregular fluctuation of the timing), the value of even the same output data acquired at the fixed timing of the strobe is not constant, and a problem has occurred that a correct test result is not obtained.

The fluctuation of the acquired data by the jitter will be described with reference to FIG. 11. As shown in FIG. 11(a), the output data of the LSI to be measured has the jitter with a width in a certain range, and a change point (rising or falling edge) of the output data shifts by the jitter width. Therefore, when the output data having this jitter is taken in at the fixed strobe, as shown in FIG. 11(b), for example, the acquired data is "H" in case of "output data 1", but the data is "L" in case of "output data 2".

Therefore, in the conventional test equipment which acquires the output data by the fixed strobe, the data which is originally the same fluctuates by an influence of jitter, and a problem has occurred that correct test or judgment is difficult. Especially, the influence of the jitter is a serious problem for a high speed LSI.

It is to be noted that to measure/analyze the jitter of the LSI to be measured, the output data of the LSI to be measured has heretofore been measured by jitter measurement units such as an oscilloscope by repeating the measuring process a plurality of times, and a jitter amount, a distribution of jitters and the like have been analyzed based on measurement results. However, in the conventional jitter analysis using a jitter measurement unit, there is a possibility that an error is generated in the operation of the oscilloscope or the like. It is difficult to analyze the jitter with high precision. Moreover, an operation of acquiring and measuring a large number of data is complicated, and a problem that the jitter analysis requires much time and labor has been pointed out. Especially in the high speed LSI, such difficulty in the jitter analysis has been a serious problem.

Additionally, in recent years, progress of the high-rate LSI has been remarkable, and an LSI in which higher-rate processing is possible has been developed using "RapidIO" (registered trademark), "HyperTransport" (registered trademark) or the like noted as a next-generation input/output interface which achieves high-rate data transfer (e.g., CPU or the like for the next "PowerPC" (registered trademark) manufactured by IBM, Ltd.). Moreover, this type of LSI has used a constitution in which the LSI itself outputs a clock signal. Additionally, the LSI itself outputs the clock signal even in a bridge LSI for converting a bus system constituting a transmission line into the above-described "RapidIO" from the conventional PCI bus.

As a result of intensive researches, the present inventor has realized that when the output data can be acquired at a timing of the clock output from the LSI in performing the function test of the LSI outputting the clock signal by itself, the fluctuation of the acquired data by the influence of the jitter shown in FIG. 11 can be eliminated. Furthermore, it has been realized that by the use of a circuit capable of acquiring the output data at the timing of the clock output from the LSI, it is also possible to analyze the jitter of the LSI, and further the phase difference between the clock and output data output from the LSI by the jitter can also be detected.

That is, the present invention has been proposed to solve the problem involved in the above-described conventional technique, and an object is to provide a test equipment for an LSI as a device under test, in which a source synchronous circuit for outputting a clock and output data from the LSI to be measured as level data in a time series is disposed, so that a clock signal output from the LSI to be measured is usable as a timing signal for acquiring the output data of the LSI to be measured and which is capable of taking in the output data at a signal change point synchronized with a jitter and which is capable of obtaining a correct test result without being influenced by the jitter and which is suitable for a function test of a high-rate LSI having a data rate exceeding, for example, 1GHz.

Moreover, an object of the present invention is to provide a jitter analyzer and a phase difference detector for an LSI to be measured, in which by use of a source synchronous circuit for outputting level data in a time series indicating a clock and output data of the LSI to be measured, jitter analysis for the LSI to be measured and detection of a phase difference between the clock and output data by a jitter can be easily and securely performed without causing any complicated operation or error.

DISCLOSURE OF THE INVENTION

[Test Equipment for LSI to be Measured]

To achieve the above-described objects, first, according to the present invention, test equipment for an LSI to be measured compares an output signal from the LSI to be measured with predetermined expectation value data to judge whether or not the LSI to be measured is failure, and comprises: a first LSI tester which inputs a first signal output from the LSI to be measured and which acquires the first signal by a plurality of strobes having a certain timing interval to output level data in a time series; a second LSI tester which inputs a second signal output from the LSI to be measured and which acquires the second signal by a plurality of strobes having a certain timing interval to output level data in a time series; and a selection circuit which is disposed in at least one of the first and second LSI testers and which inputs the level data of the time series output from the first and second LSI testers to select the second signal input into the second LSI tester at a timing of the first signal input into the first LSI tester and which outputs the second signal as the data to be measured of the LSI to be measured.

According to the test equipment for the LSI to be measured of the present invention constituted in this manner, since the source synchronous circuit is disposed, the clock and output data output from the LSI to be measured can be acquired as the level data of the time series.

The level data of the time series indicates an edge timing which is a signal change point of the clock (or the output data) of the LSI to be measured. Therefore, when the level data indicating the edge timing of the clock can be acquired, the level data is usable as a timing signal to acquire the output data of the LSI to be measured.

Accordingly, even when the signal change points (rising edge or falling edge) of the clock and output data of the LSI to be measured fluctuate by the jitters, it is possible to take in the output data at the edge timing of the clock which has fluctuated. Therefore, in the test equipment according to the present invention, the output data of the LSI to be measured can be acquired at a timing which fluctuates in accordance with the jitter, and a correct test result can always be obtained without being influenced by the jitter.

It is to be noted that the input timing of the strobe input in the source synchronous circuit can be varied on clock and output data sides. Accordingly, the timing can be appropriately adjusted in accordance with the phase difference between the clock and output data output from the LSI to be measured.

In the clock and output data output from the LSI to be measured, phases do not necessarily constantly match each other and, for example, a set-up time is sometimes minus or plus. Therefore, when the timing of the strobe input into the source synchronous circuit is varied on the clock and output data sides in this case, the strobe can be adjusted to be output at a timing appropriate for the clock and output data having the phase difference.

Moreover, in the present invention, the first LSI tester comprises a first time interpolator including: a sequential circuit which inputs a clock output from the LSI to be measured; a delay circuit which successively inputs a strobe delayed at a certain timing interval into the sequential circuit to output the level data of the time series from the sequential circuit; and an encoder which inputs the level data of the time series output from the sequential circuit and which encodes the level data into timing data indicating an edge timing of the clock of the LSI to be measured to output the data. The second LSI tester comprises a second time interpolator including: a sequential circuit which inputs the output data from the LSI to be measured; and a delay circuit which successively inputs the strobe delayed at a certain timing interval into the sequential circuit and which allows the sequential circuit to output the level data of the time series. The selection circuit comprises a selector which selects one data from the level data of the time series input from the second time interpolator using the level data of the time series coded by the first time interpolator as a selection signal to output the data to be measured of the LSI to be measured.

According to the test equipment for the LSI to be measured of the present invention constituted in this manner, the first and second LSI testers and selection circuit constituting the source synchronous circuit can be easily established by using existing means such as the sequential or delay circuit, encoder, and selector. Accordingly, the LSI tester comprising the source synchronous circuit according to the present invention can be realized by a simple constitution without complicating or enlarging the LSI tester or increasing a cost.

Moreover, according to the source synchronous circuit constituted in this manner, the number of a plurality of sequential circuits and a delay amount of the delay circuit can be changed, and a bit width (the number of sequential circuits) or resolution (delay amount of the delay circuit) of the level data of the time series in the first and second time interpolators can be set to desired values. Accordingly, various settings are possible in accordance with a data rate, jitter width and the like, and it is possible to realize an LSI tester which is capable of coping with any LSI while having high versatility and convenience.

Furthermore, in the present invention, the second time interpolator includes an encoder which inputs the level data of the time series output from the sequential circuit and which encodes the level data into timing data indicating an edge timing of output data of the LSI to be measured to output the timing data.

According to the test equipment for the LSI to be measured of the present invention constituted in this manner, since the second time interpolator comprises the encoder, the first and second LSI testers can be formed in the same constitution. Accordingly, when a plurality of LSI testers are disposed, all the LSI testers are formed in the same constitution. Accordingly, the clock or output data of the LSI to be measured can be allocated to an optional channel of each LSI tester, and an allocation operation of the channel can be easily and efficiently performed. When the LSI tester including the same constitution is disposed in this manner, the clock or the output data of the LSI to be measured can be allocated to any of the plurality of LSI testers. When a plurality of clocks or output data are output from the LSI to be measured, optional output data can be acquired at the optional timing of the clock, and a highly versatile and convenient test equipment capable of coping with any LSI can be realized.

Furthermore, the present invention includes a a bus which is connected to the first and second LSI testers and which distributes data output from the first and second LSI testers to a predetermined selection circuit.

According to the test equipment for the LSI to be measured of the present invention constituted in this manner, since the bus for inputting the level data of the time series output from the first and second LSI testers to allocate the data to the selection circuit is disposed, a desired clock is allocated to desired output data and input into the selection circuit, and the data to be measured can be acquired. Accordingly, even when a plurality of first and second LSI testers and selection circuits are arranged in accordance with the LSI to be measured, the clocks and output data can be optionally combined to take in the data to be measured, and an LSI tester having a higher versatility and convenience can be realized.

[Jitter Analyzer of LSI to be Measured]

Next, a jitter analyzer for an LSI to be measured of the present invention acquires/analyzes distribution of jitters of an output signal from the LSI to be measured, and comprises: a first LSI tester which inputs the output signal from the LSI to be measured and which acquires the output signal by a plurality of strobes having certain timing intervals to output level data in a time series; and jitter distribution analysis means for inputting the level data of the time series output from the first LSI tester to acquire the timing of the output signal input into the first LSI tester and for outputting the distribution of jitters of the output signal.

According to the jitter analyzer of the LSI to be measured of the present invention constituted in this manner, since a source synchronous circuit according to the present invention is disposed, the level data of the time series indicating a signal change point (edge timing) of a clock or output data output from the LSI to be measured can be acquired. Therefore, since a plurality of level data indicating the signal change point of the clock or output data are acquired/accumulated, it is possible to analyze the distribution of the signal change points of each data that fluctuates by the jitter.

Accordingly, in the jitter analyzer according to the present invention, the jitter can be easily analyzed with high precision without causing a problem of an error by the operation of an oscilloscope or difficulty in a measurement operation, unlike the use of a conventional jitter measurement unit.

Moreover, in the present invention, the first LSI tester comprises a time interpolator including: a sequential circuit which inputs an output signal from the LSI to be measured; a delay circuit which successively inputs strobes delayed at certain timing intervals into the sequential circuit and which allows the sequential circuit to output the level data of the time series; and an encoder which inputs the level data of the time series output from the sequential circuit and which encodes the level data into timing data indicating the edge timing of the output signal of the LSI to be measured to output the timing data.

According to the jitter analyzer of the LSI to be measured of the present invention constituted in this manner, the first LSI tester constituting the source synchronous circuit can be easily established by using the existing means such as the sequential or delay circuit, and encoder. Accordingly, the jitter analyzer using the source synchronous circuit according to the present invention can be realized by a simple constitution without complicating or enlarging the jitter analyzer or increasing the cost.

Moreover, according to the source synchronous circuit constituted in this manner, the number of a plurality of sequential circuits, and the delay amount of the delay circuit can be changed, and the bit width (the number of sequential circuits) or resolution (the delay amount of the delay circuit) of the level data of the time series in the time interpolator can be set to desired values. Accordingly, various settings are possible in accordance with the data rate, jitter width and the like, and it is possible to realize a jitter analyzer which is capable of coping with any LSI while having high versatility and convenience.

Additionally, according to the present invention, the LSI tester for the clock can be formed in the same constitution as that of the LSI tester for the output data. Accordingly, the jitter can be analyzed with respect to the optional clock and output data of the LSI to be measured using the jitter analyzer according to the present invention, and a jitter analyzer having a remarkably high versatility can be realized.

Moreover, in the present invention, the jitter distribution analysis means comprises a storage circuit which stores timing data output from the encoder, and is constituted to acquire the distribution of edge timings of output signals input into the first LSI tester from a plurality of data stored in the storage circuit.

According to the jitter analyzer of the LSI to be measured of the present invention constituted in this manner, a plurality of timing data indicating the signal change point of the clock or output data of the LSI to be measured output from the encoder can be stored/accumulated in the storage circuit (memory). Accordingly, the timing data can be analyzed/processed using optional methods such as a method in which a plurality of timing data stored in the storage circuit is subjected to software processing, for example, by a CPU to obtain a jitter histogram including the distribution of clocks or output data. Additionally, the storage circuit which stores the timing data is simply added to the LSI tester, then the jitter analyzer according to the present invention can be constituted, and therefore the jitter analyzer according to the present invention can be realized by the simple constitution without complicating or enlarging the jitter analyzer or increasing the cost.

Moreover, in the present invention, the jitter distribution analysis means comprises: a decoder which inputs the timing data output from the encoder and which decodes the timing data into the level data of the time series to output the level data; and a plurality of counters which count the output signals of the decoder for each output terminal, and is constituted to acquire a distribution of edge timings of the output signals input into the first LSI tester from a plurality of data output from the counter.

According to the jitter analyzer of the LSI to be measured of the present invention constituted in this manner, the timing data indicating the signal change point of the clock or the output data of the LSI to be measured output from the encoder is combined by the decoder, and the output of the decoder can be counted for each output terminal by the counter. Moreover, when a plurality of clocks or output data of the LSI to be measured are acquired, the signal change points of the data can be counted to obtain the distribution.

Accordingly, for example, data output from the counter is read and graphed as such, a jitter histogram indicating the distribution of clocks or output data can be obtained, and a higher-rate jitter analysis is possible as compared with a case where the data is stored once in the storage circuit and subsequently analyzed. It is to be noted that the number of counters which count outputs of decoders correspond to a measurable range (resolution) of the level data of the time series by the time interpolator, and is concretely preferably set to the same number as that of sequential circuits.

[Phase Difference Detector of LSI to be Measured]

Furthermore, a phase difference detector for an LSI to be measured of the present invention detects a phase difference between first and second signals output from the LSI to be measured, and comprises: a first LSI tester which inputs a first signal output from the LSI to be measured and which acquires the first signal as data by a plurality of strobes having a certain timing interval to output level data in a time series; a second LSI tester which inputs a second signal output from the LSI to be measured and which acquires the second signal as data by a plurality of strobes having a certain timing interval to output level data in a time series; and a phase difference detection circuit which is disposed in at least one of the first and second LSI testers and which inputs the level data of the time series output from the first and second LSI testers to calculate a difference between a timing of the first signal input into the first LSI tester and that of the second signal input into the second LSI tester and which outputs the phase difference.

According to the phase difference detector of the LSI to be measured of the present invention constituted in this manner, since a source synchronous circuit according to the present invention is disposed, the level data of the time series indicating the signal change point (edge timing) of the clock and output data output from the LSI to be measured can be acquired. Moreover, when the level data indicating edge timings of the clock and output data is subjected to subtraction, it is possible to detect the phase difference between the clock and the output data. Accordingly, in the present invention, the phase difference between the clock and output data of the LSI to be measured can be acquired/analyzed easily and securely without using any conventional jitter measurement unit.

Moreover, concretely, in the present invention, the first LSI tester comprises a first time interpolator including: a sequential circuit which inputs a clock output from the LSI to be measured; a delay circuit which successively inputs a strobe delayed at a certain timing interval into the sequential circuit to output the level data of the time series from the sequential circuit; and an encoder which inputs the level data of the time series output from the sequential circuit and which encodes the level data into timing data indicating an edge timing of the clock of the LSI to be measured to output the data. The second LSI tester comprises a second time interpolator including: a sequential circuit which inputs the output data output from the LSI to be measured; a delay circuit which successively inputs the strobe delayed at a certain timing interval into the sequential circuit and which allows the sequential circuit to output the level data of the time series; and an encoder which inputs the level data of the time series output from the sequential circuit and which encodes the level data into timing data indicating an edge timing of the output data of the LSI to be measured to output the data. The phase difference detection circuit comprises: a calculation circuit which subtracts the level data of the time series encoded by the first time interpolator and the level data of the time series encoded by the second time interpolator; and a decoder which decodes a calculation result of the calculation circuit, and is constituted to output the data decoded by the decoder as a phase difference between the clock and output data of the LSI to be measured.

According to the phase difference detection circuit for the LSI to be measured of the present invention constituted in this manner, the first and second LSI testers and phase difference detection circuit constituting the source synchronous circuit can be easily constituted using the existing means such as the order or delay circuit, encoder, subtraction circuit, and decoder. Accordingly, a phase difference detector comprising the source synchronous circuit according to the present invention can be realized by the simple constitution without complicating or enlarging the phase difference detector or increasing the cost.

Moreover, according to the source synchronous circuit constituted in this manner, the number of the plurality of sequential circuits and the delay amount of the delay circuit can be changed, and the bit width (the number of sequential circuits) or resolution (the delay amount of the delay circuit) of the level data of the time series in the first and second time interpolators can be set to an optional value. Accordingly, various settings are possible in accordance with the data rate, jitter width and the like, and it is possible to realize a phase difference detector which is capable of coping with any LSI and which has high versatility and convenience.

Additionally, according to the present invention, since the first and second LSI testers can be formed in the same constitution, the source synchronous circuit having the same constitution according to the present invention can be disposed with respect to all channels of the phase difference detector. Accordingly, the clock or output data of the LSI to be measured can be optionally allocated to a plurality of LSI testers, and the allocation operation of the channels can be easily and efficiently performed. Moreover, since the clock or output data of the LSI to be measured can be allocated to the optional channel in this manner, it is possible to realize a highly versatile and convenient test equipment which is capable of acquiring the phase difference between the clock and output data by an optional combination and which is capable of coping with any LSI in a case where a plurality of clocks or output data are output from the LSI to be measured.

Moreover, in the present invention, the phase difference detection circuit comprises a plurality of counters which count output signals of the decoder for each output terminal, and is constituted to acquire a distribution of phase differences between the clock input into the first LSI tester and the output data input from the second LSI tester from a plurality of data output from the counter.

According to the phase difference detector for the LSI to be measured of the present invention constituted in this manner, an output of the decoder indicating the phase difference between the clock and output data of the LSI to be measured can be counted by the counter for each output terminal. Moreover, when a plurality of clocks and output data of the LSI to be measured are acquired, a distribution of phase differences between the clock and output data can be obtained. Accordingly, for example, the data output from the counter is read and graphed as such, and accordingly a jitter histogram indicating the distribution of the phase differences between clocks or output data can be obtained. It is to be noted that the number of counters which count the outputs of decoders is preferably set to be equal to the number of phase differences calculated by a subtraction circuit.

Furthermore, the present invention includes a constitution comprising a bus which is connected to the first and second LSI testers and which distributes data output from the first and second LSI testers to a predetermined phase difference detection circuit.

According to the phase difference detector of the LSI to be measured of the present invention constituted in this manner, since the bus for inputting the level data of the time series output from the first and second LSI testers to distribute the data to the phase difference detection circuit is disposed, the desired clock is allocated to desired output data and input into the phase difference detection circuit, and the phase difference data can be acquired.

Accordingly, even when a plurality of first and second LSI testers and phase difference detection circuits are arranged in accordance with the LSI to be measured, the clocks and output data can be optionally combined to take in the phase difference data, and a phase difference detector having a higher versatility or convenience can be realized.

BRIEF DESCRIPTION OF THE DRAWINGS

FIGS. 2(a) and 2(b) are signal diagrams showing an operation for acquiring output data at an edge timing of a clock of the LSI to be measured in the first embodiment of the test equipment for the LSI to be measured according to the present invention;

FIGS. 8(a) and 8(b) are signal diagrams showing an operation for acquiring a phase difference between the clock and output data of the LSI to be measured in the first embodiment of the phase difference detector for the LSI to be measured according to the present invention;

FIGS. 11(a) and 11(b) are signal diagrams showing the output data of the LSI to be measured in the conventional test equipment for the LSI to be measured, FIG. 11 (a) shows a jitter of output data, and FIG. 11(b) shows a state in which an error is generated in the acquired data by the jitter.

BEST MODE FOR CARRYING OUT THE INVENTION

Preferable embodiments of test equipment, jitter analyzer, and phase difference detector for an LSI to be measured according to the present invention will be described hereinafter with reference to the drawings.

[Test Equipment for LSI to be Measured]

First, an embodiment of the test equipment for the LSI to be measured according to the present invention will be described with reference to FIGS. 1 to 3.

[First Embodiment]

A first embodiment of the test equipment for the LSI to be measured according to the present invention will be described hereinafter with reference to FIGS. 1 and 2.

Figure 1:
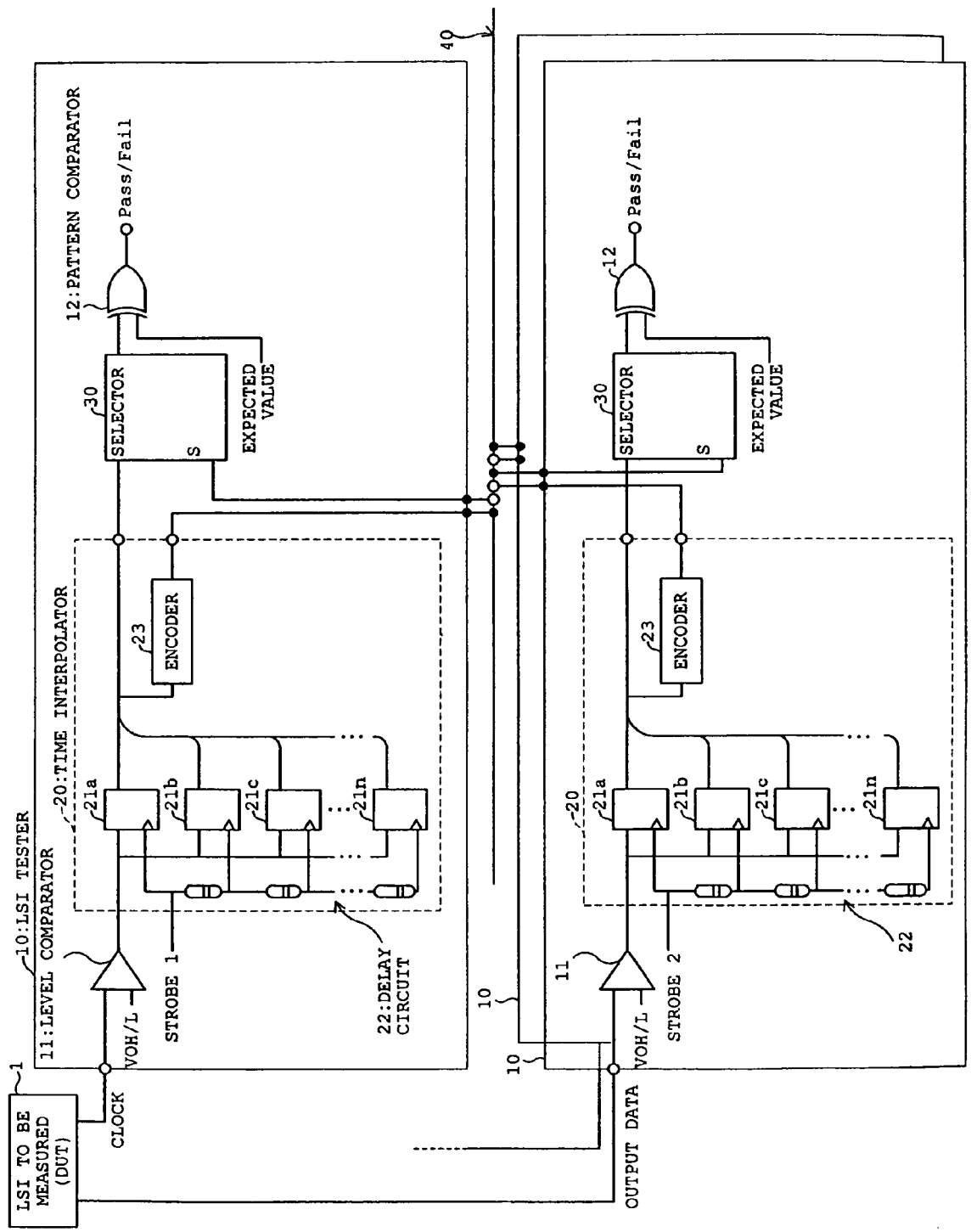
FIG. 1 is a block diagram showing a constitution of a first embodiment of test equipment for an LSI to be measured according to the present invention.

FIG. 1 is a block diagram showing a constitution of the first embodiment of the test equipment for the LSI to be measured according to the present invention. As shown in FIG. 1, the test equipment for the LSI to be measured according to the present embodiment comprises an LSI tester 10 which performs a function test of an LSI to be measured 1. The LSI tester 10 acquires output data output from the LSI to be measured 1 as data to be measured, and compares this data with predetermined expectation value data to judge whether or not the LSI to be measured is failure.

The LSI to be measured inputs a signal from a pattern generation unit or the like (not shown) to output predetermined output data, and also outputs a clock signal. As the LSI which outputs the clock by itself, for example, there is an LSI using the technology called "RapidIO" (registered trademark), "HyperTranport" (registered trademark) or the like, a bridge LSI for converting a bus system to "RapidIO" from a PCI bus or the like.

Moreover, in the present embodiment, when the clock output from the LSI to be measured 1 is input into a plurality of LSI testers 10, the output data of the LSI to be measured 1 is acquired at a clock timing of the LSI to be measured 1, and output as data to be measured. Concretely, the LSI tester 10 constitutes a source synchronous circuit in which the clock and output data of the LSI to be measured 1 are acquired by a plurality of strobes having certain timing intervals, and output as the level data of the time series, and the output data is selected/acquired using the level data of the time series at the edge timing of the clock of the LSI to be measured 1.

First, in the LSI tester 10 constituting the source synchronous circuit, the LSI tester 10 including the same constitution is allocated to each clock and output data output from the LSI to be measured 1.

In the present embodiment, as shown in FIG. 1, one LSI tester 10 (first LSI tester of the present invention) is disposed on the side of the clock of the LSI to be measured 1, and one to n LSI testers 10 (second LSI tester of the present invention) are disposed on the side of the output data of the LSI to be measured 1. Moreover, the LSI testers 10 are connected to each other via a time interpolator bus 40, and signals are input/output between predetermined channels (LSI testers 10) by control of the time interpolator bus 40 as described later.

As shown in FIG. 1, each LSI tester 10 includes the same constitution, and concretely comprises a level comparator 11, a pattern comparator 12, a time interpolator 20, and a selector 30.

The level comparator 11 inputs an output signal (clock or output data) from the LSI to be measured 1, and compares a level with that of a predetermined comparison voltage to output a signal to the time interpolator 20.

The pattern comparator 12 compares the output data of the LSI to be measured 1 selected by the selector 30 via the time interpolator 20 described later with a predetermined expectation value to output a comparison result.

The time interpolator 20 acquires the clock or output data output from the LSI to be measured 1 by a plurality of strobes having certain timing intervals to output level data of the time series. Concretely, the time interpolator 20 comprises flip flops 21a to 21n constituting a plurality of sequential circuits, a delay circuit 22, and an encoder 23.

The plurality of flip flops 21a to 21n comprises a D-type flip flop group connected in parallel in the present embodiment, and the output signal (clock or output data) output from the LSI to be measured via the level comparator 11 is input as input data. Moreover, the strobe input via the delay circuit 22 is used as a clock signal, and data input at a predetermined timing is output.

The delay circuit 22 successively inputs the strobe delayed at a certain timing interval into clock terminals of a plurality of flip flops 21a to 21n, and the level data of the time series is output from the flip flops 21a to 21n.

Here, the number of a plurality of flip flops 21a to 21n, and a delay amount of the delay circuit 22 can be optionally set and changed, and a bit width (the number of sequential circuits) or resolution (delay amount of the delay circuit) of the level data of the time series acquired in the time interpolator 20 can be set to a desired value. Accordingly, the acquired level data of the time series can be variously set in accordance with a data rate, jitter width or the like of the LSI to be measured 1 constituting a test object, and it is possible to cope with any LSI.

Moreover, timings of inputs of the strobes input into the flip flops 21a to 21n via the delay circuit 22 can be varied on the clock and output data sides. In the present embodiment, when different timing generation units and the like are disposed for the respective LSI testers 10, the strobes are independently input on the clock and output data sides ("strobe 1" on the clock side shown in FIG. 1 and "strobe 2" on the output data side). Accordingly, the timing can be adjusted to be appropriate in accordance with the phase difference between the clock and output data output from the LSI to be measured 1. In the clock and output data output from the LSI to be measured 1, the phases do not constantly match each other and, for example, a set-up time is sometimes minus or plus. Therefore, in this case, the timing of the strobe is varied on the clock and output data sides, and the strobe can be adjusted to be output at the timing appropriate for the clock and output data having the phase difference.

The encoder 23 inputs the level data of the time series output from the plurality of flip flops 21a to 21n, and encodes and outputs the level data. Concretely, the encoder 23 successively inputs the data from the flip flops 21a to 21n at a certain interval, and encodes the data in a timing when the data are input from all the flip flops 21a to 21n to output the result. Accordingly, the level data of the time series output from the flip flops 21a to 21n is encoded and output.

Moreover, in the present embodiment, the encoder 23 of the clock-side LSI tester 10 inputs the level data of the time series output from a plurality of flip flops 21a to 21n to encode the level data into timing data indicating an edge timing of the clock of the LSI to be measured 1, and outputs the data.

It is to be noted that although not shown in the example shown in FIG. 1, an interleave circuit is inserted on the output side of the encoder 23, an FIFO circuit is inserted in the flip flops 21a to 221n and the selector 30, and accordingly data transfer to the selector 30 can be speeded up.

Moreover, in the LSI tester 10 on the output data side as described later, the level data of the time series output from the flip flops 21a to 21n is input directly into the selector 30. That is, in the present embodiment, the encoder 23 on the output data side is not used. Therefore, with respect to the LSI tester 10 on the output data sides, it is possible to omit the encoder 23 in the present embodiment.

The selector 30 is a selection circuit which inputs the level data of the time series output from the plurality of flip flops 21a to 21n to select the output data of the corresponding LSI to be measured 1 at the edge timing of the clock of the LSI to be measured 1 and which outputs the data to be measured of the LSI to be measured 1.

Concretely, the selector 30 comprises a multiplexer and the like, the plurality of flip flops 21a to 21n are connected on a data input side, and the time interpolator bus 40 is connected to a select signal terminal.

Moreover, in the present embodiment, the level data of the time series output from the flip flops 21a to 21n on the output data side is input into the selector 30 on the output data side, and the level data of the time series encoded by the encoder 23 of the clock-side time interpolator 20 is input as a selection signal of the selector 30 on the output data side by control of the time interpolator bus 40.

Accordingly, since the level data of the time series output from the flip flops 21a to 21n of the time interpolator 20 on the output data side is input as input data in the selector 30 on the output data side, one data is selected from the level data on the output data side using the signal from the encoder 23 on the clock side as the selection signal. Moreover, the output data of the LSI to be measured 1 selected by the selector 30 is output to the pattern comparator 12, and compared with a predetermined expectation value in the pattern comparator 12, and the test result is output.

It is to be noted that with respect to the selector 30 disposed in the LSI tester 10 on the clock side, the selection signal is not input by the control of the time interpolator bus 40 described later. That is, the selector 30 (and the pattern comparator 12) on the clock side is not used in the present embodiment. Therefore, with respect to the LSI tester 10 on the clock side, the selector 30 (and the pattern comparator 12) can be omitted. In other words, the selector 30 may be disposed in at least one of the LSI testers 10 on the clock and output data sides as long as the output signals are input from the time interpolators 20 on the clock and output data sides.

The time interpolator bus 40 is a transmission line connected to the clock-side LSI tester 10 and output data side LSI tester 10, and is controlled so as to distribute the data output from each LSI tester 10 to a predetermined selector 30.

As shown in FIG. 1, the time interpolator bus 40 is connected to an output terminal of the encoder 23 of each channel (LSI tester 10) and a select terminal of the selector 30 via a switch having two points IN/OUT, and ON/OFF of the switch is controlled so as to input either the clock or the output data into each channel. In an example shown in FIG. 1, OUT of the clock side LSI tester 10 with respect to the encoder 23 is turned ON, and IN of the output data side LSI tester 10 with respect to the selector 30 is ON ("●" on the time interpolator bus 40 shown in FIG. 1 shows ON, and "○" shows OFF). Accordingly, the level data is input as the select signal into the selector 30 of the corresponding channel (the output data side LSI tester 10 in FIG. 1) from the clock side LSI tester 10.

It is to be noted that either switch is OFF in a case where any data is not input into the corresponding channel from either the clock side or the output data side.

Here, information indicating the clock or output data whose signal is input into any channel is usually given beforehand. Therefore, in accordance with the information, the operation of the switch to be turned ON/OFF can be set before using the test equipment. This ON/OFF control information can be written in a register for control (not shown) or the like.

When the time interpolator bus 40 is disposed, the level data of the time series output from the LSI testers 10 on the clock and output data sides can be input into the time interpolator bus 40 and distributed to the predetermined selector 30. Accordingly, a desired clock can be allocated to the desired output data to acquire the data to be measured.

Therefore, even when a plurality of LSI testers 10 each including the selector 30 are arranged in accordance with the constitution of the LSI to be measured 1, data rate, jitter width or the like, the respective clocks and output data can be optionally combined to take in the data to be measured.

For example, when a plurality of clocks and output data are sent from the LSI to be measured 1, the data can be allocated to the optional LSI tester 10 like "clock 1 and output data 1" and "clock 2 and output data 2". Moreover, in this case, the data to be measured can be independently acquired at a timing "clock 1" with respect to "output data 1" and a timing "clock 2" with respect to "output data 2". It is to be noted that when a plurality of LSI testers 10 are arranged, a plurality of time interpolator buses 40 for distributing the data to each LSI tester 10 are also arranged for the respective LSI testers 10.

Next, an operation of the test equipment for the LSI to be measured according to the present embodiment constituted as described above will be described.

First, when a predetermined test pattern signal is input into the LSI to be measured 1 from a pattern generation unit (not shown) disposed in the test equipment, output data and clock corresponding to a pattern signal are output from the LSI to be measured 1. The clock and output data from the LSI to be measured 1 are input into separate channels (LSI testers 10). The clock and output data input into each LSI tester 10 are input into the level comparator 11, level-compared with a comparison voltage, and thereafter input into each time interpolator 20.

The signal (clock or output data) input into the time interpolator 20 is first input into the plurality of flip flops 21a to 21n connected in parallel.

Moreover, the strobe is input into a clock terminal of each of the flip flops 21a to 21n in which the clock or output data is input by the delay circuit 22 at the certain timing interval. Accordingly, the input clock or output data is acquired and output as the level data of the time series from each of the flip flops 21a to 21n.

Moreover, in the clock side LSI tester 10, the level data of the time series output from the flip flops 21a to 21n are input into the encoder 23, and encoded. The level data encoded by the encoder 23 is timing data indicating the edge timing (rising or falling edge) of the clock.

The timing data is input into the time interpolator bus 40, distributed into the predetermined output data side LSI tester 10 via the time interpolator bus 40, and input as the selection signal into the selector 30 of the corresponding output data side LSI tester 10.

On the other hand, in the output data side LSI tester 10, the level data of the time series acquired by the flip flops 21a to 21n is input as such into the selector 30. Accordingly, in the selector 30 on the output data side, one data is selected from the level data of the time series indicating the output data using the timing data input from the clock side LSI tester 10 as the selection signal, and the data is output as the data to be measured.

Moreover, the output data output from the selector 30 on the output data side is input into the pattern comparator 12, and compared with predetermined expectation value data output from the pattern generation unit in the tester to output a comparison result. Agreement/disagreement of the output data with respect to the expectation value is detected by the comparison result, and it is judged whether or not the LSI to be measured 1 is failure (Pass/Fail). That is, when the output of the selector 30 agrees with the expectation value, judgment of pass is made. In case of the disagreement, judgment of fail is made.

A concrete example will be described hereinafter with reference to FIGS. 2(*a*) and 2(*b*).

FIGS. 2(*a*) and 2(*b*) are signal diagrams showing an operation for acquiring output data at an edge timing of a clock of the LSI to be measured 1 in the test equipment of the present embodiment.

In the example shown in the figure, each LSI tester 10 comprises four flip flops 21a to 21d, and the clock and output data output from the LSI to be measured 1 are acquired as the level data indicating bit number "4". Therefore, the selector 30 which selects the output data comprises a 4-1 type MUX and the like.

First, in the signal shown in FIG. 2(*a*), an edge timing in which the clock output from the LSI to be measured 1 changes to "H" from "L" is a position of bit number "1", whereas in the output data, the timing of the signal change point at which the output data changes to "H" from "L" is a position of bit number "0" (bold line portion of the figure). In this case, first, with respect to the clock, for example, level data "0111" ("H" from the position of the bit number "1") is acquired by the flip flops 21a to 21n of the clock side LSI tester 10. This data is encoded into timing data (e.g., "01") indicating the bit number "1" by the encoder 23.

On the other hand, in the output data, for example, level data "1111" ("H" from the position of bit number "0") is acquired by the flip flops 21a to 21d of the output data side LSI tester 10, and the data is input into each input terminal of the selector 30. Moreover, in the selector 30 on the output data side, the data of the input terminal corresponding to bit number "1" is selected by the selection signal input from the clock side and, as a result, the data output from the selector 30 is "H".

The relationship among the above-described data is summarized in Table 1.

TABLE 1

| Encoder input (clock) | Encoder output | Selector input (output data) | | Selector output |
|---|---|---|---|---|
| 0111 | 01 ("1") | 00 | 1 | |
| | | 01 | 1 | 1 |
| | | 10 | 1 | |
| | | 11 | 1 | |

On the other hand, the signal shown in FIG. 2(b) shows a case where both the clock and the output data shift from the signal of FIG. 2(a) by the phase (for 2 bits) by the jitter. In this case, the edge timing in which the clock changes to "H" from "L" is a position of bit number "3", whereas the timing of a signal change point at which the output data changes to "H" from "L" is a position of bit number "2" (bold line portion of the figure). Therefore, in the clock, for example, level data "0001" ("H" from the position of the bit number "3") is acquired by the flip flops 21a to 21d of the clock side LSI tester 10. Moreover, the data is encoded into timing data (e.g., "11") indicating the bit number "3" by the encoder 23.

On the other hand, in the output data, for example, level data "0001" ("H" from the position of bit number "2") is acquired by the flip flops 21a to 21d of the output data side LSI tester 10, and the data is input into each input terminal of the selector 30. In the selector 30 on the output data side, the data of the input terminal corresponding to bit number "3" is selected by the selection signal input from the clock side and, as a result, the data output from the selector 30 is "H" in the same manner as in FIG. 2(a). The relationship among the above-described data is summarized in Table 2.

TABLE 2

| Encoder input (clock) | Encoder output | Selector input (output data) | | Selector output |
|---|---|---|---|---|
| 0001 | 11 ("3") | 00 | 0 | |
| | | 01 | 0 | |
| | | 10 | 1 | |
| | | 11 | 1 | 1 |

Therefore, both in FIGS. 2(a) and 2(b), the signal change point fluctuates by the jitter, but the output data "H" is acquired as the data to be measured in either case. When this situation is tested by the conventional test equipment of the fixed strobe, "H" is acquired in FIG. 2(a), "L" is acquired in FIG. 2(b), and the data to be measured is not constant (see FIG. 11). Even when the signal change points (edge timings) of the clock and output data of the LSI to be measured 1 fluctuate by the jitter in this manner in the test equipment of the present embodiment, the same result can be constantly acquired in a case where the clock and output data shift by the same phase.

As described above, according to the test equipment of the LSI to be measured according to the present embodiment, a plurality of LSI testers 10 constituting the source synchronous circuit according to the present invention are disposed, and accordingly the clock and output data output from the LSI to be measured 1 can be acquired as the level data of the time series. The level data of the time series indicates the edge timing which is the signal change point of the clock or output data of the LSI to be measured 1, and the level data indicating the edge timing of the clock can be used as the timing signal to acquire the output data of the LSI to be measured 1. Accordingly, even when the signal change points (rising or falling edges) of the clock and output data of the LSI to be measured 1 fluctuate by the jitter, it is possible to take in the output data at the edge timing of the clock which has fluctuated.

Therefore, in the test equipment according to the present embodiment, the output data of the LSI to be measured 1 can be acquired at the timing which fluctuates in accordance with the jitter, and a correct test result can be constantly obtained without being influenced by the jitter.

Moreover, in the present embodiment, a plurality of LSI testers 10 constituting the source synchronous circuit can be easily constituted using existing means such as an order or delay circuit, encoder, and selector. Accordingly, the LSI tester 10 can be realized by a simple constitution without complicating or enlarging the LSI tester or increasing a cost.

Furthermore, in the present embodiment, the LSI testers 10 on the clock and output data sides comprise the encoder 23 in the time interpolator 20, each time interpolator 20 comprises the selector 30 (and the pattern comparator 12), and a plurality of LSI testers 10 are formed in the same constitution. Accordingly, the clock or output data of the LSI to be measured 1 can be allocated to optional channels of the plurality of LSI testers 10, and the allocation operation of the channels can be easily and efficiently performed.

Moreover, since the clock or output data of the LSI to be measured 1 can be allocated to the optional channel in this manner, it is possible to acquire optional output data at the optional timing of the clock in a case where a plurality of clocks or output data are output from the LSI to be measured 1. Accordingly, in the present embodiment, highly convenient and versatile test equipment capable of coping with any LSI can be realized.

[Second Embodiment]

Next, a second embodiment of the test equipment for the LSI to be measured according to the present invention will be described with reference to FIG. 3.

Figure 3:
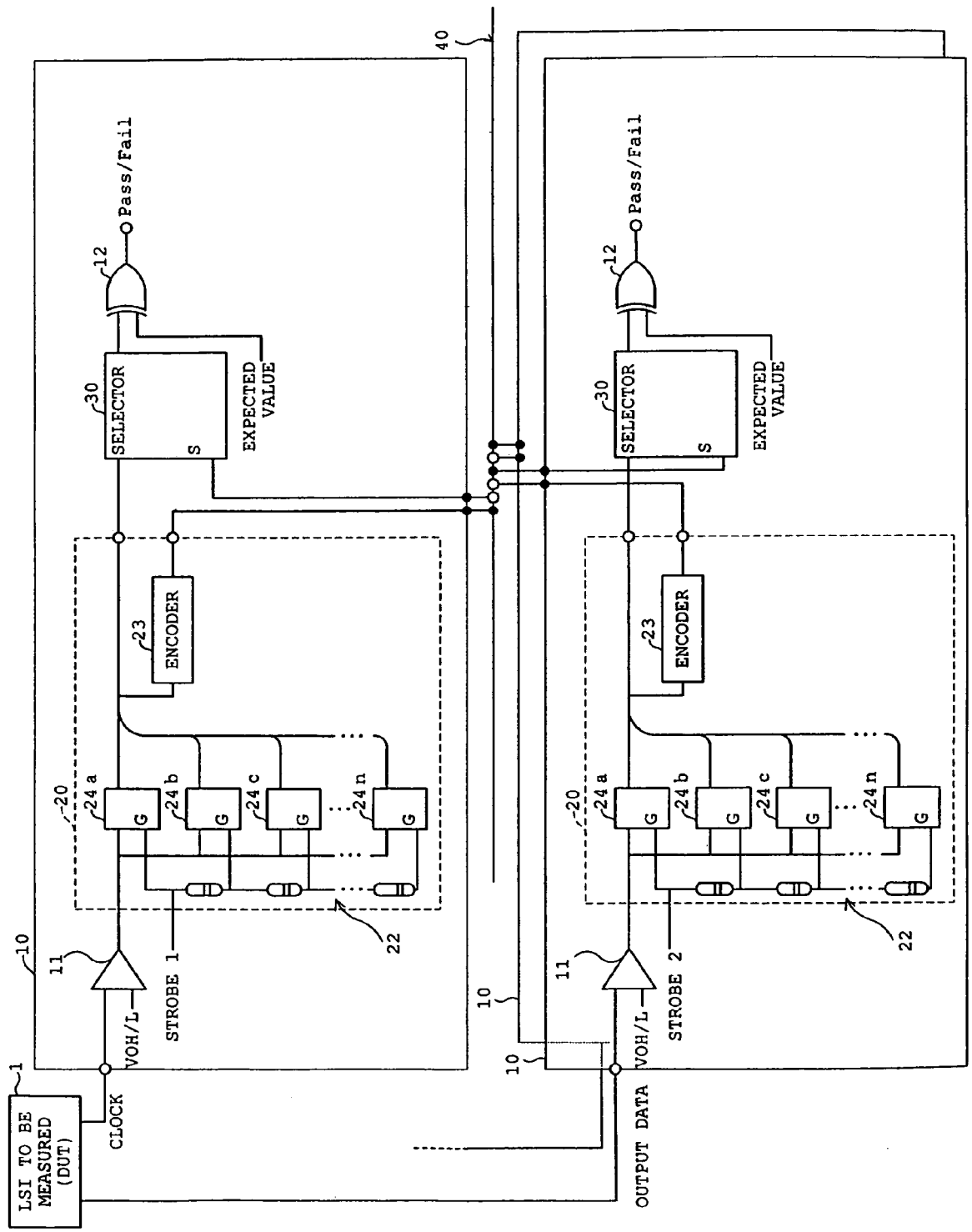
FIG. 3 is a block diagram showing a constitution of a second embodiment of the test equipment for the LSI to be measured according to the present invention.

FIG. 3 is a block diagram showing a constitution of the second embodiment of the test equipment for the LSI to be measured according to the present invention. The test equipment for the LSI to be measured according to the present embodiment shown in the figure is a modified embodiment of the first embodiment shown in FIG. 1, and latches 24a to 24n are disposed as a plurality of sequential circuits disposed in each LSI tester 10 instead of the flip flops 21a to 21n. Therefore, the other constituting parts are similar to those of the first embodiment, the similar constituting parts are denoted with the same reference numerals as those of the first embodiment in the figure, and detailed description is omitted.

Even when the latches 24a to 24n are disposed as the sequential circuits disposed in the time interpolator 20 on the clock and output data sides, an effect similar to that of the above-described first embodiment can be produced. That is, even according to the present embodiment, the LSI tester 10 comprising the source synchronous circuit according to the present invention can be realized by a simple constitution without complicating or enlarging the time interpolator 20 or increasing the cost. It is to be noted that the sequential circuit disposed in the time interpolator 20 may have any circuit constitution in addition to the flip flops 21a to 21n in the first embodiment or the latches 24a to 24n in the present embodiment, as long as the clock and output data from the LSI to be measured 1 can be acquired at the certain timing interval, and output as the level data of the time series.

[Jitter Analyzer of LSI to be Measured]

Next, an embodiment of a jitter analyzer for an LSI to be measured according to the present invention will be described with reference to FIGS. 4 to 6.

[First Embodiment]

A first embodiment of the jitter analyzer for the LSI to be measured according to the present invention will be described hereinafter with reference to FIGS. 4 and 5.

Figure 4:
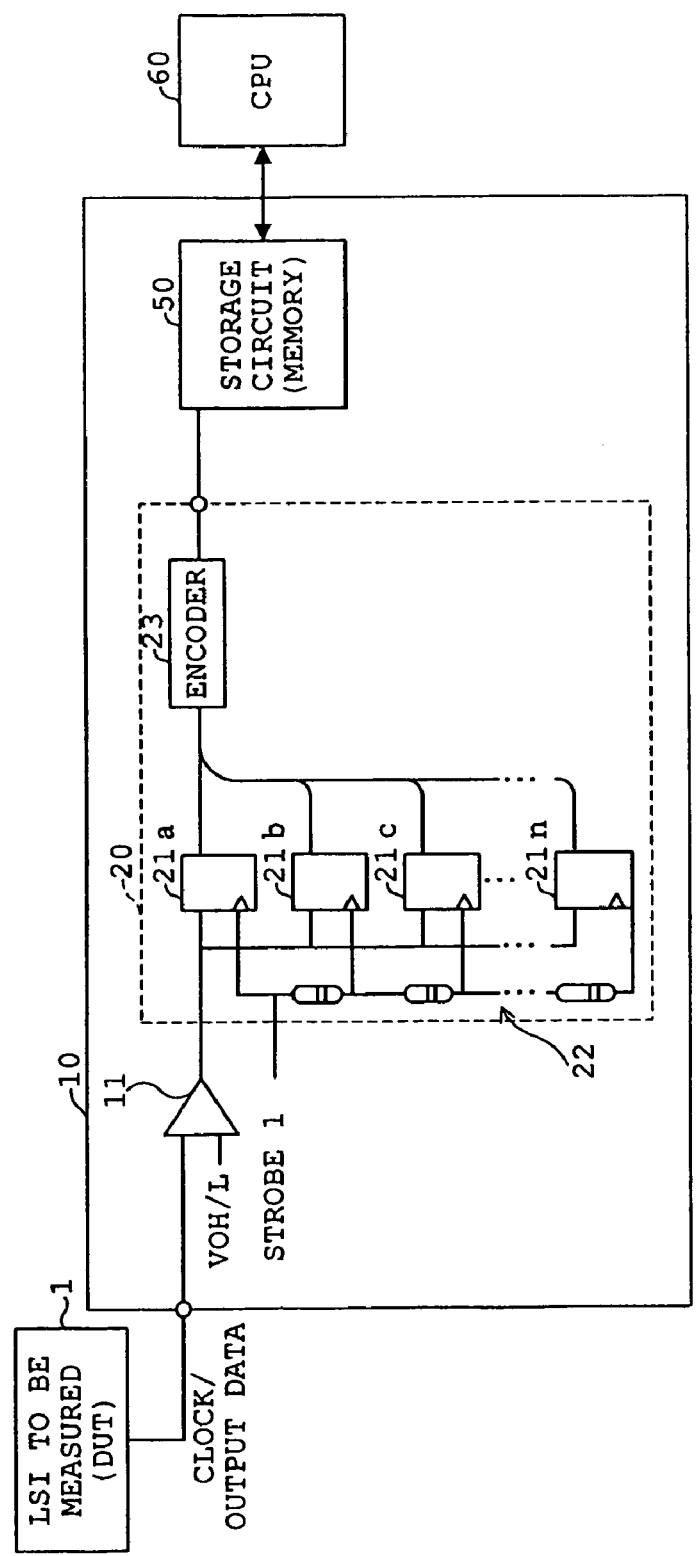
FIG. 4 is a block diagram showing the constitution of the first embodiment of a jitter analyzer for the LSI to be measured according to the present invention.

FIG. 4 is a block diagram showing the constitution of the first embodiment of the jitter analyzer for the LSI to be measured according to the present invention. As shown in FIG. 4, the jitter analyzer for the LSI to be measured according to the present embodiment includes a constitution substantially similar to that of the LSI tester 10 in the test equipment for the LSI to be measured shown in FIG. 1. Additionally, the jitter analyzer of the present embodiment comprises a storage circuit (memory) 50 and a CPU 60 instead of the selector 30 and pattern comparator 12 of the LSI tester 10 in FIG. 1.

Moreover, unlike the test equipment of FIG. 1, in the present embodiment, the jitter of the clock or output data of the LSI to be measured 1 can be individually acquired/analyzed, and it is not necessary to combine and acquire the clock and output data. Therefore, either the clock or output data may be input into the LSI tester 10 from the LSI to be measured 1, and the time interpolator bus 40 (see FIG. 1) for connecting a plurality of LSI testers 10 (see FIG. 1) is not disposed.

The other constitution is similar to that of the LSI tester 10 shown in FIG. 1.

As shown in FIG. 4, the LSI tester 10 (first LSI tester of the present invention) disposed in the jitter analyzer of the present embodiment is a source synchronous circuit including jitter distribution analysis means for inputting the level data of the time series output from the time interpolator 20 to acquire the edge timing of the clock or output data from the LSI to be measured 1 and for outputting the distribution of jitters of the clock or output data. Concretely, as the jitter distribution analysis means, the storage circuit 50 is disposed to store the timing data output from the encoder 23 of the LSI tester 10. Moreover, a plurality of clocks or output data are acquired from the LSI tester 10 to store a plurality of level data in the storage circuit 50, and distribution of edge timings of the clock or output data of the LSI to be measured is acquired from the stored data.

An operation of the jitter analyzer for the LSI to be measured according to the present embodiment will be described with reference to FIG. 5. FIG. 5 is an explanatory view of a case where a jitter distribution of the clock or output data of the LSI to be measured is acquired/analyzed in the jitter analyzer for the LSI to be measured according to the present invention.

First, the timing data indicating the signal change point of the clock (or the output data) of the LSI to be measured 1 is acquired via the flip flops 21a to 21n and encoder 23 of the LSI tester 10 in the same manner as in the test equipment shown in FIG. 1.

The acquired timing data is stored/accumulated in the storage circuit 50. This timing data is acquired as the level data, for example, of five bits, and indicates the edge timings of the clock (or the output data) like "01101", "00111", "01000", . . . as shown in FIG. 5.

Figure 5:
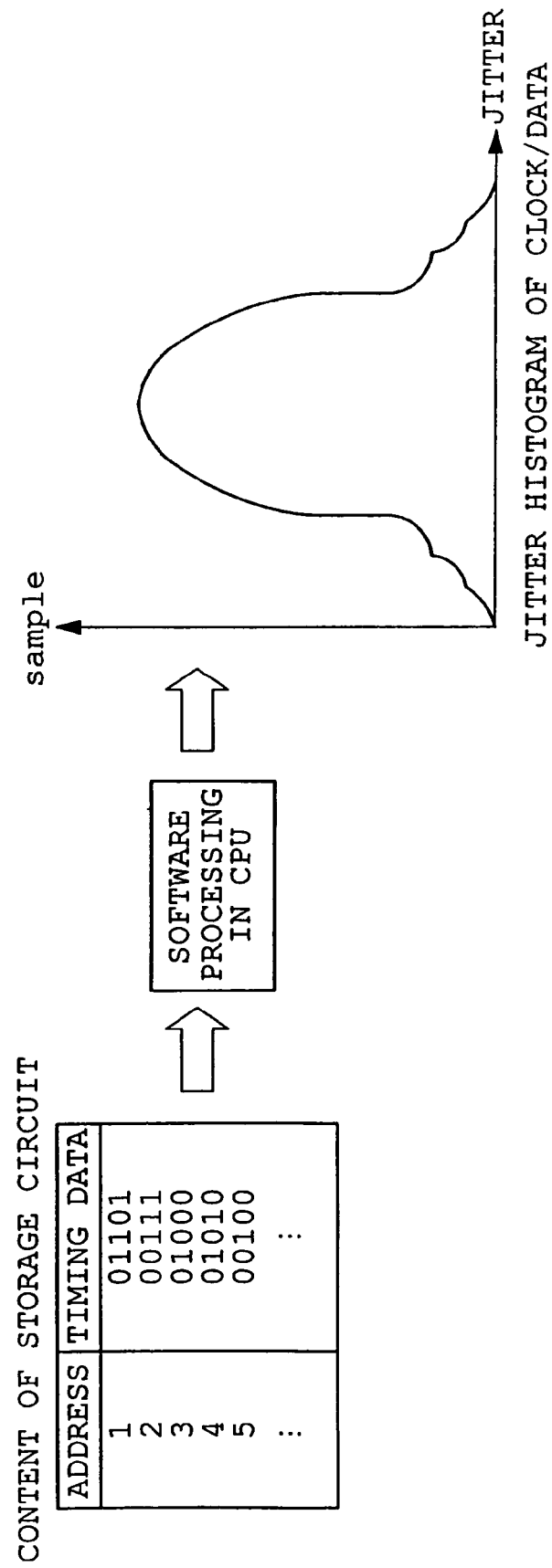
FIG. 5 is an explanatory view of a case where a jitter distribution of a clock or output data of the LSI to be measured is acquired/analyzed in the first embodiment of the jitter analyzer for the LSI to be measured according to the present invention.

Therefore, the data is read from the storage circuit 50, and subjected to software processing by the CPU, and accordingly a correct jitter histogram indicating the distribution of clocks or output data can be obtained, for example, in a graph of FIG. 5.

In this manner, according to the jitter analyzer for the LSI to be measured of the present embodiment, the LSI tester 10 constituting the source synchronous circuit according to the present invention is disposed, and accordingly the level data of the time series indicating the signal change point (edge timing) of the clock or output data output from the LSI to be measured 1 can be acquired.

Therefore, when a plurality of level data indicating the signal change point of the clock or output data are acquired/accumulated, it is possible to analyze a distribution of signal change points of each data that fluctuates by the jitter. Accordingly, in the jitter analyzer according to the present embodiment, a high-precision jitter analysis can be easily performed without causing a problem of an error by the operation of an oscilloscope or difficulty in a measurement operation, unlike the use of a conventional jitter measurement unit.

Especially in the jitter analyzer of the present embodiment, since the LSI tester 10 comprises the storage circuit 50, a plurality of timing data indicating the signal change point of the clock or output data of the LSI to be measured 1 output from the encoder 23 can be stored/accumulated in the storage circuit 50. Accordingly, the timing data can be analyzed using optional methods such as a method in which a plurality of timing data accumulated in the storage circuit 50 are subjected to the software processing by the CPU 60 to obtain a jitter histogram including a distribution of clocks or output data.

Moreover, the jitter analyzer simply comprising the storage circuit 50 in the LSI tester 10 can be formed in a simple constitution without being complicated, enlarged, or increased in cost.

Additionally, in the present embodiment, since the jitter analyzer for the clock has the same constitution as that of the jitter analyzer for the output data, the jitter can be analyzed with respect to the optional clock and output data of the LSI to be measured using the jitter analyzer according to the present embodiment, and a remarkably highly versatile jitter analyzer can be provided.

[Second Embodiment]

Next, a second embodiment of the jitter analyzer for the LSI to be measured according to the present invention will be described with reference to FIG. 6.

Figure 6:
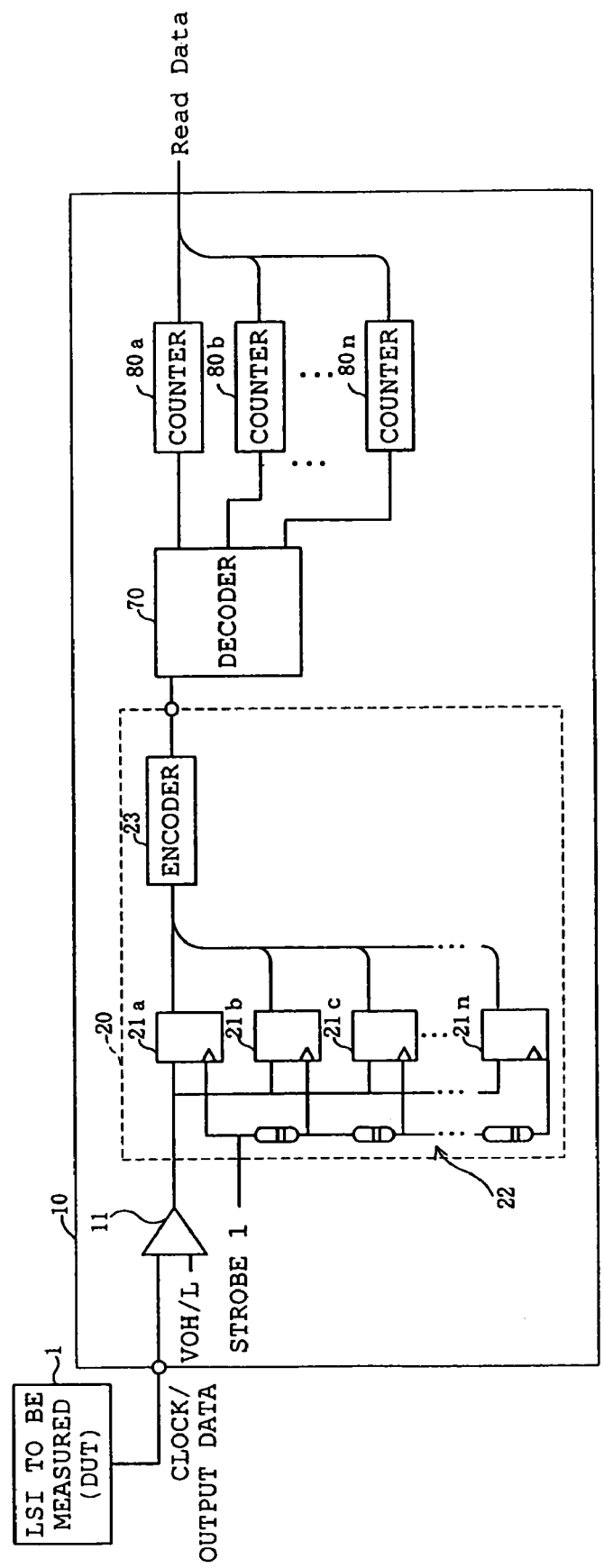
FIG. 6 is a block diagram showing a constitution of a second embodiment of the jitter analyzer for the LSI to be measured according to the present invention.

FIG. 6 is a block diagram showing a constitution of the second embodiment of the jitter analyzer for the LSI to be measured according to the present invention. As shown in FIG. 6, the jitter analyzer for the LSI to be measured according to the present embodiment comprises a decoder 70 and a plurality of counters 80a to 80n as jitter distribution analysis means instead of the storage circuit 50 (and the CPU 60) shown in FIG. 4.

The other constitution is similar to that of the LSI tester 10 of FIG. 4 (or FIG. 1).

As shown in FIG. 6, the decoder 70 inputs the coded timing data output from the encoder 23, and decodes the data into the level data of the time series to output the data. Moreover, the plurality of counters 80a to 80n count output signals of the decoder 70 for each output terminal.

A distribution of edge timings of the clock or output data of the LSI to be measured 1 can be acquired from a plurality of data output from the counters 80a to 80n.

Concretely, distribution of edge timings of the clock or output data is acquired as follows. For example, when the clock (or the output data) output from the LSI to be measured 1 is acquired and analyzed as the level data of 4 bits in the same manner as in the signal shown in FIGS. 2(*a*) and 2(*b*), the edge timing to change the clock (or the output data) output from the LSI to be measured 1 to "H" from "L" fluctuates between positions of bit numbers "0" and "3".

When the signal is processed by the LSI tester 10 of the present embodiment, the flip flops 21*a* to 21*n*, and the encoder 23 and the decoder 70 acquire data as follows.

TABLE 3

| Position of signal change point of clock (output data) | FF output (4 bits) | Encoder output (2 bits) | Decoder output (4 bits) |
|---|---|---|---|
| "0" | 1111 | 00 | 0001 |
| "1" | 0111 | 01 | 0010 |
| "2" | 0011 | 10 | 0100 |
| "3" | 0001 | 11 | 1000 |

As shown in Table 3, in the data output from the decoder 70, only the output terminal indicating the signal change point of the clock (or output data) of the LSI to be measured 1 indicates "H", and the other output terminals indicate "L". Therefore, when the output signals of the decoder 70 are counted for each output terminal of the decoder 70 by the plurality of counters 80*a* to 80*n*, the distribution of the edge timings of the clock or output data of the LSI to be measured 1 can be acquired.

As described above, according to the jitter analyzer of the LSI to be measured according to the present embodiment, timing data indicating the signal change point of the clock or output data of the LSI to be measured 1 output from the encoder 23 are combined, the outputs of the decoder 70 are counted for each output terminal by the counters 80*a* to 80*n*, and accordingly the signal change points of the respective clocks or output data of the LSI to be measured 1 can be counted to obtain the distribution. Accordingly, for example, data output from the counters 80*a* to 80*n* can be read and graphed as such to obtain the jitter histogram indicating the distribution of clocks or output data, and higher-rate jitter analysis is possible as compared with a case where the analysis is performed after storing the data once in the storage circuit.

It is to be noted that the number of counters 80*a* to 80*n* to count the outputs of the decoder 70 corresponds to a measurable range (resolution) of the level data of the time series by the time interpolator 20, and is concretely preferably set to be equal to the number of sequential circuits comprising the flip flops 21*a* to 21*n* and the like.

[Phase Difference Detector of LSI to be Measured]

Furthermore, an embodiment of a phase difference detector for the LSI to be measured according to the present invention will be described with reference to FIGS. 7 to 9.

[First Embodiment]

A first embodiment of the phase difference detector for the LSI to be measured according to the present invention will be described hereinafter with reference to FIGS. 7 and 8.

Figure 7:
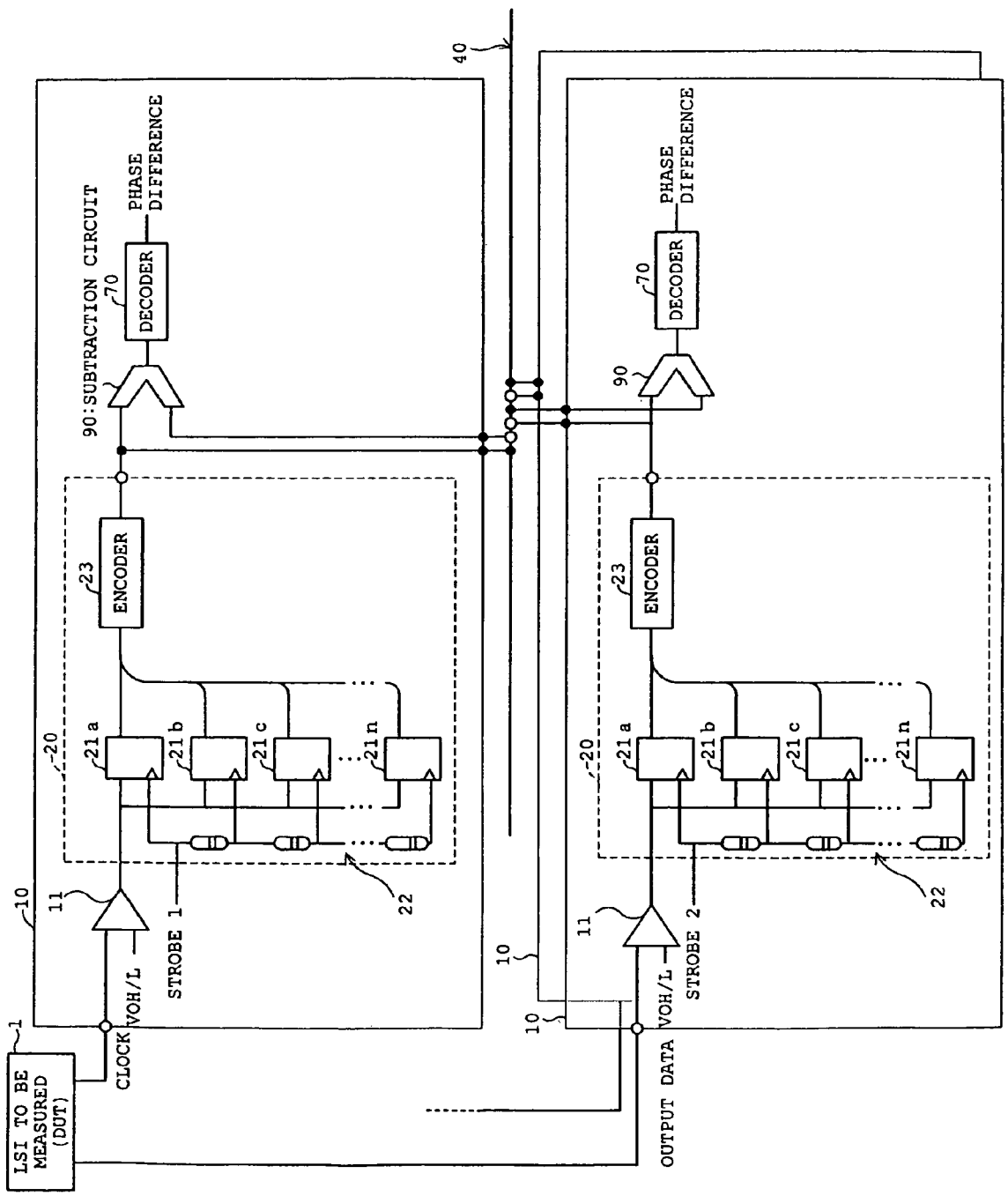
FIG. 7 is a block diagram showing a constitution of the first embodiment of a phase difference detector for the LSI to be measured according to the present invention.

FIG. 7 is a block diagram showing a constitution of the first embodiment of the phase difference detector for the LSI to be measured according to the present invention. As shown in FIG. 7, the phase difference detector for the LSI to be measured according to the present embodiment has a constitution substantially similar to that of the LSI tester 10 in the test equipment for the LSI to be measured shown in FIG. 1. Additionally, the phase difference detector of the present embodiment comprises a subtraction circuit 90 and decoder 70 instead of the selector 30 and pattern comparator 12 of the LSI tester 10 in FIG. 1.

The other constitution is similar to that of the LSI tester 10 shown in FIG. 1.

As shown in FIG. 7, the LSI tester 10 disposed in the phase difference detector of the present embodiment constitutes a source synchronous circuit including a phase difference detection circuit which inputs the level data of the time series output from the time interpolator 20 to acquire the edge timings of the clock and output data output from the LSI to be measured 1 and which calculates a difference of the signal change point (edge timing) between the clock and output data to output a phase difference. Concretely, the LSI tester 10 comprises the subtraction circuit 90 and decoder 70.

The subtraction circuit 90 subtracts the coded level data (timing data) output from each encoder 23 of the LSI tester 10 on the clock and output data sides.

Moreover, the decoder 70 decodes a subtraction result of the subtraction circuit 90 to convert the result to a value having a weight of a delay amount by the delay circuit 22 of the time interpolator 20 as described later, and outputs the phase difference.

It is to be noted that the subtraction circuit 90 may be any calculation circuit capable of calculating the coded level data (timing data) from the respective encoders 23 on the clock and output data sides, and in addition to the subtraction circuit, for example, an addition circuit may also be used.

Moreover, when optional clock and output data are acquired from the LSI to be measured 10 using a plurality of LSI testers 10 in the same manner as in the test equipment shown in FIG. 1, the phase difference between the desired clock and output data can be detected via the subtraction circuit 90 and decoder 70.

Concretely, the LSI testers 10 on the clock and output data sides (first and second LSI testers of the present invention) are connected to each other via the time interpolator bus 40 in the same manner as in the test equipment shown in FIG. 1. Accordingly, the level data of the time series coded by the encoder 23 of the time interpolator 20 on the clock or output data side is input into the subtraction circuit 90 on the output data or clock side by the control of the time interpolator bus 40.

It is to be noted that the subtraction circuit 90 (and the decoder 70) disposed in the LSI tester 10 on either of the output data and clock sides may be used in the same manner as in the selector 30 in the test equipment shown in FIG. 1, and the subtraction circuit 90 (and the decoder 70) disposed in the other LSI tester 10 may not be used. Therefore, the subtraction circuit 90 and decoder 70 may be omitted with respect to the LSI tester 10 on the clock or output data side. In other words, the subtraction circuit 90 and decoder 70 constituting a phase difference detection circuit may be disposed in at least one of the LSI testers 10 on the clock and output data sides as long as the output signals from the time interpolators 20 on the clock and output data sides are input.

A concrete operation of the phase difference detector for the LSI to be measured according to the present embodiment will be described hereinafter with reference to FIGS. 8(*a*) and 8(*b*).

FIGS. 8(*a*) and 8(*b*) are signal diagrams showing an operation for acquiring a phase difference between the clock and output data of the LSI to be measured in the phase difference detector for the LSI to be measured according to the present embodiment.

An example shown in the figure shows a case where the clock and output data output from the LSI to be measured 1 are acquired as the level data of bit number "4" by each LSI tester 10 and a weight of 1 bit, that is, a delay amount by the delay circuit 22 is "50 ps". First, the timing data indicating the signal change points of the clock and output data of the LSI to be measured 1 is acquired via the flip flops 21a to 21n and encoder 23 of the LSI tester 10 in the same manner as in the test equipment shown in FIG. 1. The acquired timing data is subjected to the subtraction in the subtraction circuit 90, and the subtraction result is converted and output in the decoder 70.

In FIG. 8(a), the edge timing when the clock output from the LSI to be measured 1 changes to "H" from "L" is a position of bit number "1", whereas the timing of the signal change point at which the output data turns to "H" from "L" is a position of bit number "0" (bold line portion of the figure). Therefore, the timing data (e.g., "01") indicating the bit number "1" is output from the encoder 23 on the clock side, and the timing data (e.g., "00") indicating the bit number non is output from the encoder 23 on the output data side.

Moreover, when the timing data is subjected to the subtraction in the subtraction circuit 90, the following results:

"0"−"1"="−1", and the phase difference between the clock and output data is calculated as "−1" bit. In the present example, since a weight of 1 bit is "50 ps", the output of the subtraction circuit 90 is multiplied by the weight of 1 bit and converted as follows by the decoder 70:

"−1"*"50"="−50".

As a result, a phase difference "−50 ps" between the clock and output data is acquired.

On the other hand, in FIG. 8(b), the edge timing when the clock output from the LSI to be measured 1 changes to "H" from "L" is similarly the position of bit number "1", whereas the timing of the signal change point at which the output data turns to "H" from "L" varies to a position of bit number "3" (bold line portion of the figure). Therefore, the timing data (e.g., "01") indicating the bit number "1" is output from the encoder 23 on the clock side, and the timing data (e.g., "11") indicating the bit number "3" is output from the encoder 23 on the output data side.

Moreover, when the timing data is subjected to the subtraction in the subtraction circuit 90, the following results:

"3"−"1"="2", and the phase difference between the clock and output data is calculated as "2" bits.

Moreover, the output of the subtraction circuit 90 is multiplied by the weight of 1 bit ("50 ps") and converted as follows by the decoder 70:

"2"*"50"="100".

As a result, a phase difference "100 ps" between the clock and output data is acquired.

As described above, according to the phase difference detector for the LSI to be measured according to the present embodiment, since the LSI tester 10 constituting the source synchronous circuit according to the present invention is disposed, the level data of the time series indicating the signal change points (edge timings) of the clock and output data output from the LSI to be measured 1 can be acquired.

Moreover, when the level data indicating the edge timings of the clock and output data are subjected to the subtraction using the subtraction circuit 90 and decoder 70, it is possible to detect the phase difference between the clock and output data. Accordingly, the phase difference between the clock and output data of the LSI to be measured can be easily and securely acquired and analyzed without using any conventional jitter measurement unit in the present embodiment.

Furthermore, according to the present embodiment, since the LSI testers 10 on the clock and output data sides are formed in the same constitution, the clock and output data of the LSI to be measured 1 can be allocated to optional channels of the plurality of LSI testers 10 disposed in the phase difference detector in the same manner as in the test equipment shown in FIG. 1, and the allocation operation of the channels can be easily and efficiently performed.

Moreover, since the clock or output data of the LSI to be measured 1 can be allocated to the optional channel in this manner, the phase difference between the clock and output data by an optional combination can be acquired in a case where a plurality of clocks or output data are output from the LSI to be measured 1, and a highly versatile and convenient phase difference detector capable of coping with any LSI can be realized.

[Second Embodiment]

Next, a second embodiment of the phase difference detector for the LSI to be measured according to the present invention will be described with reference to FIG. 9.

Figure 9:
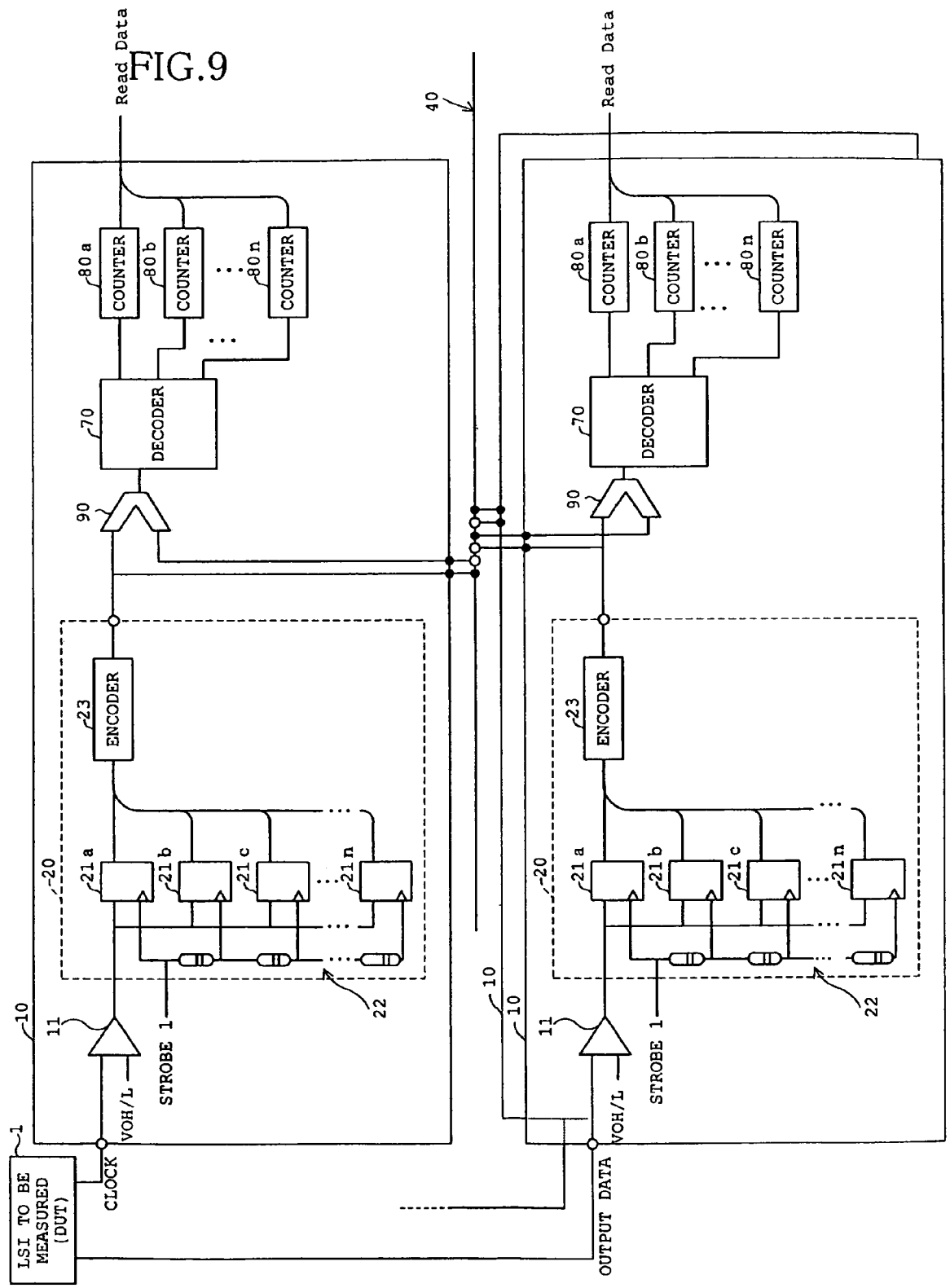
FIG. 9 is a block diagram showing a constitution of the second embodiment of the phase difference detector for the LSI to be measured according to the present invention.
Figure 10:
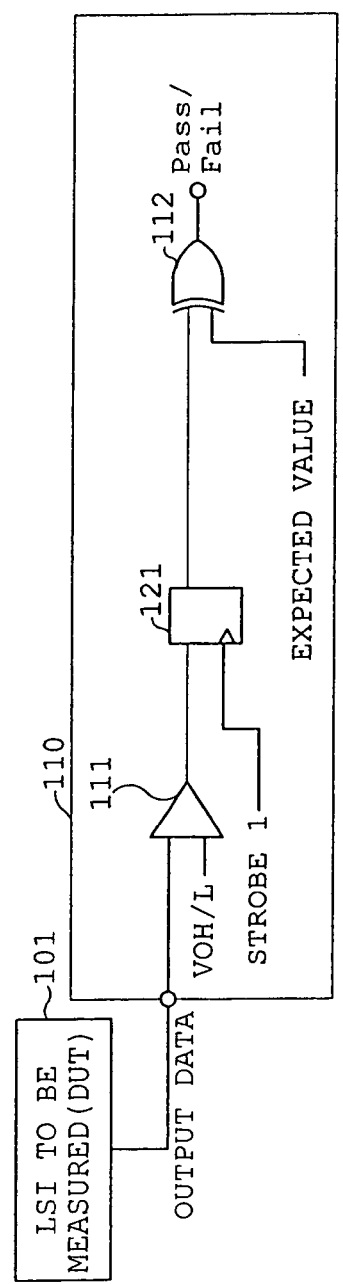
FIGS. 10 is a block diagram showing a constitution of a conventional test equipment for an LSI to be measured.

FIG. 9 is a block diagram showing a constitution of the second embodiment of the phase difference detector for the LSI to be measured according to the present invention. As shown in FIG. 9, the phase difference detector for the LSI to be measured according to the present embodiment further comprises a plurality of counters 80a to 80n to count the output signals of the decoder 70 for each output terminal in the phase difference detector shown in FIG. 7, and is constituted to acquire a distribution of phase differences between the clock and output data of the LSI to be measured 1 from a plurality of data output from the counters 80a to 80n.

When the phase difference between the clock and output data output from the LSI to be measured 1 is acquired, the output result of the subtraction circuit 90 is decoded by the decoder 70, accordingly only the output terminal indicating the phase difference between the clock and output data of the LSI to be measured 1 is set to "H", the other output terminals are set to "L", and the phase difference between the clock and output data of the LSI to be measured 1 can be output. Moreover, the output signals of the decoder 70 are counted for each output terminal of the decoder 70 by a plurality of counters 80a to 80n, and accordingly a distribution of the phase differences between the clock and output data of the LSI to be measured 1 can be acquired.

The data shown in FIGS. 8(a) and 8(b) will be concretely described hereinafter as an example.

When the clock and output data output from the LSI to be measured 1 are acquired as the level data of the bit number "4" by four flip flops 21a to 21d in the time interpolator 20 of each LSI tester 10, four data (0, 1, 2, 3) indicating the signal change points of the clock and output data are acquired on each of the clock and output data sides. Moreover, when the level data of the clock and output data are subjected to subtraction in the subtraction circuit 90, seven values (−3, −2, −1, 0, 1, 2, 3) can be acquired as the outputs of the subtraction circuit 90.

Therefore, when the seven output results are decoded by the decoder 70 indicating an output bit number "7", the data of each output terminal of the decoder 70 are counted by seven counters 80a to 80g, and accordingly a distribution of phase difference between the clock and output data of the LSI to be measured 1 can be acquired.

The relationship among the data is shown in Tables 4 and 5 as follows.

It is to be noted that in the following table, the "decoder output" and "counter output" correspond to the phase differences (−3, −2, −1, 0, 1, 2, 3) downwards from above.

TABLE 4

Data shown in FIG. 8(a)

| | Encoder | Subtraction circuit output | Phase difference | Decoder output | Counter |
|---|---|---|---|---|---|
| Clock side | 01 ("1") | 0 − 1 = −1 | −3 | 0 | 0 |
| | | | −2 | 0 | 0 |
| | | | −1 | 1 | 1 |
| Output data side | 00 ("0") | | 0 | 0 | 0 |
| | | | 1 | 0 | 0 |
| | | | 2 | 0 | 0 |
| | | | 3 | 0 | 0 |

TABLE 5

Data shown in FIG. 8(b)

| | Encoder | Subtraction circuit output | Phase difference | Decoder output | Counter output |
|---|---|---|---|---|---|
| Clock side | 01 ("1") | 3 − 1 = 2 | −3 | 0 | 0 |
| | | | −2 | 0 | 0 |
| | | | −1 | 0 | 1 |
| Output data side | 11 ("3") | | 0 | 0 | 0 |
| | | | 1 | 0 | 0 |
| | | | 2 | 1 | 1 |
| | | | 3 | 0 | 0 |

As shown in Tables 4 and 5, in the data output from the decoder 70, only the output terminal indicating the phase difference between the clock and output data of the LSI to be measured 1 indicates "H", and the other output terminals indicate "L". Therefore, "counter output" shows a total of continuously acquired data of FIGS. 8(a) and 8(b), and as a result of data acquisition twice, Table 5 shows a result of one counted phase difference "−1" and one counted phase difference "2". Accordingly, when the output signals of the decoder 70 are counted for each output terminal of the decoder 70 by plurality of counters 80a to 80n, a distribution of phase differences between the clock and output data of the LSI to be measured 1 can be acquired.

As described above, according to the phase difference detector of the LSI to be measured according to the present embodiment, the outputs of the decoder 70 indicating the phase difference between the clock and output data of the LSI to be measured 1 can be counted for each output terminal by the counters 80a to 80n. Moreover, when a plurality of clocks and output data of the LSI to be measured 1 are acquired, the distribution of phase differences between the clock and output data can be easily and correctly obtained.

Accordingly, for example, when the data output from the counters 80a to 80n are read and graphed, a histogram indicating the distribution of the phase differences between the clock and output data can be easily obtained.

It is to be noted that the test equipment, jitter analyzer, and phase difference detector for the LSI to be measured of the present invention are not limited to the above-described embodiments and, needless to say, various modifications/implementations are possible in the scope of the present invention.

As described above, according to a test equipment for an LSI as a device under test of the present invention, a source synchronous circuit is disposed which outputs a clock and output data from the LSI to be measured as level data in a time series, accordingly a clock signal output from the LSI to be measured is usable as a timing signal to acquire output data of the LSI to be measured, and it is possible to take in the output data at a signal change point synchronized with a jitter.

Accordingly, a test equipment for an LSI to be measured can be realized which is capable of obtaining a correct test result without being influenced by the jitter of the output data of the LSI to be measured and which is suitable, for example, for a function test of a high-rate LSI having a data rate exceeding, for example, 1 GHz.

Moreover, according to a jitter analyzer and a phase difference detector of the present invention, by the use of a source synchronous circuit which outputs level data in a time series indicating the clock and output data of the LSI to be measured, jitter analysis of the LSI to be measured and detection of a phase difference between the clock and output data by the jitter can be easily and securely performed without causing any complicated operation, error or the like.

The invention claimed is:

1. Test equipment for an LSI as a device under test, which compares an output signal output from the LSI to be measured as data to be measured with predetermined expectation value data to judge whether or not the LSI to be measured is failure, the test equipment comprising:
    a first LSI tester which inputs a first signal output from the LSI to be measured and which acquires the first signal by a plurality of strobes having a certain timing interval to output level data in a time series, the first LSI tester having a first time interpolator which is comprised of:
        a sequential circuit which inputs the first signal output from the LSI to be measured;
        a delay circuit which successively inputs a strobe delayed at a certain timing interval into the sequential circuit to output the level data of the time series from the sequential circuit; and
        an encoder which inputs the level data of the time series output from the sequential circuit and which encodes the level data into timing data indicating an edge timing of the clock of the LSI to be measured to output the data;
    a second LSI tester which inputs a second signal output from the LSI to be measured and which acquires the second signal by a plurality of strobes having a certain timing interval to output level data in a time series, the second LSI tester having a second time interpolator which is comprised of:
        a sequential circuit which inputs the second signal output from the LSI to be measured; and
        a delay circuit which successively inputs the strobe delayed at a certain timing interval into the sequential circuit and which allows the sequential circuit to output the level data of the time series; and a selection circuit which is disposed in at least one of the first and second LSI testers and which inputs the level data of the time series output from the first and second LSI testers to select the second signal input into the second LSI tester at a timing of the first signal input into the first LSI tester and which outputs the second signal as the data to be measured of the LSI to be measured, the selection circuit comprising a selector which selects one data from the level data of the time series input from the second time interpolator using the level data of the time series coded by the first time interpolator as a selection signal to output data to be measured of the LSI to be measured.

2. The test equipment for the LSI as a device under test according to claim 1, wherein the first signal is a clock from the LSI to be measured, and the second signal is output data from the LSI to be measured.

3. The test equipment for the LSI as a device under test according to claim 1, wherein the second time interpolator includes an encoder which inputs the level data of the time series output from the sequential circuit and which encodes the level data into timing data indicating the edge timing of the output data of the LSI to be measured to output the timing data.

4. The test equipment for the LSI as a device under test according to claim 1, further comprising a bus which is connected to the first and second LSI testers and which distributes data output from the first and second LSI testers to a predetermined selection circuit.

5. A phase difference detector for an LSI as a device under test, which detects a phase difference between first and second signals output from the LSI to be measured, comprising:
  a first LSI tester which inputs a first signal output from the LSI to be measured and which acquires the first signal as data by a plurality of strobes having a certain timing interval to output level data in a time series, the first LSI tester having a first time interpolator which is comprised of:
    a sequential circuit which inputs the first signal output from the LSI to be measured;
    a delay circuit which successively inputs a strobe delayed at a certain timing interval into the sequential circuit to output the level data of the time series from the sequential circuit; and
    an encoder which inputs the level data of the time series output from the sequential circuit and which encodes the level data into timing data indicating an edge timing of the clock of the LSI to be measured to output the data;
  a second LSI tester which inputs a second signal output from the LSI to be measured and which acquires the second signal as data by a plurality of strobes having a certain timing interval to output level data in a time series, the second LSI tester having a second time interpolator which is comprised of:
    a sequential circuit which inputs the second signal output from the LSI to be measured; and
    a delay circuit which successively inputs the strobe delayed at a certain timing interval into the sequential circuit and which allows the sequential circuit to output the level data of the time series; and
  a phase difference detection circuit which is disposed in at least one of the first and second LSI testers and which inputs the level data of the time series output from the first and second LSI testers to calculate a difference between a timing of the first signal input into the first LSI tester and that of the second signal input into the second LSI tester and which outputs the phase difference.

6. The phase difference detector for the LSI as a device under test according to claim 5, wherein the phase difference detection circuit comprises:
  a calculation circuit which subtracts the level data of the time series encoded by the first time interpolator and the level data of the time series encoded by the second time interpolator; and
  a decoder which decodes a calculation result of the calculation circuit, and
  the phase difference detector outputs the data decoded by the decoder as a phase difference between the clock and output data of the LSI to be measured.

7. The phase difference detector for the LSI as a device under test according to claim 6, wherein the phase difference detection circuit comprises a plurality of counters which count output signals of the decoder for each output terminal, and
  the phase difference detector acquires a distribution of phase differences between the clock input into the first LSI tester and the output data input from the second LSI tester from a plurality of data output from the counter.

8. The phase difference detector for the LSI as a device under test according to claim 5, further comprising a bus which is connected to the first and second LSI testers and which distributes data output from the first and second LSI testers to a predetermined phase difference detection circuit.

9. A jitter analyzer for an LSI as a device under test, which acquires/analyzes a distribution of jitters of an output signal from the LSI to be measured, comprising:
  a first LSI tester which inputs the output signal output from the LSI to be measured and which acquires the output signal by a plurality of strobes having certain timing intervals to output level data in a time series; and
  jitter distribution analysis means for inputting the level data of the time series output from the first LSI tester to acquire a timing of the output signal input into the first LSI tester and for outputting the distribution of the jitters of the output signal;
  wherein the first LSI tester has a first time interpolator which is comprised of:
    a sequential circuit which inputs the first signal output from the LSI to be measured;
    a delay circuit which successively inputs a strobe delayed at a certain timing interval into the sequential circuit to output the level data of the time series from the sequential circuit; and
    an encoder which inputs the level data of the time series output from the sequential circuit and which encodes the level data into timing data indicating an edge timing of the clock of the LSI to be measured to output the data.

10. The jitter analyzer for the LSI as a device under test according to claim 9, wherein the jitter distribution analysis means comprises a storage circuit which stores the timing data output from the encoder, and
  the jitter analyzer acquires the distribution of edge timings of output signals input into the first LSI tester from a plurality of data stored in the storage circuit.

11. The jitter analyzer for the LSI as a device under test according to claim 9, wherein the jitter distribution analysis means comprises:

a decoder which inputs the timing data output from the encoder and which decodes the timing data into the level data of the time series to output the level data; and a plurality of counters which count the output signals of the decoder for each output terminal, and the jitter analyzer acquires a distribution of edge timings of the output signals input into the first LSI tester from a plurality of data output from the counter.

* * * * *